US005745838A

United States Patent [19]
Tresness et al.

[11] Patent Number: 5,745,838
[45] Date of Patent: Apr. 28, 1998

[54] RETURN PATH FILTER

[75] Inventors: Andrew F. Tresness, Manlius; Martin L. Zelenz, DeWitt, both of N.Y.

[73] Assignee: Tresness Irrevocable Patent Trust, Syracuse, N.Y.

[21] Appl. No.: 818,231

[22] Filed: Mar. 14, 1997

[51] Int. Cl.[6] .............................. H04H 1/00; H04N 7/14
[52] U.S. Cl. ............................. 455/5.1; 348/7; 348/12
[58] Field of Search .......................... 455/3.1, 4.1, 4.2, 455/5.1, 6.1; 348/6, 7, 8, 12, 13; 359/124, 125, 154, 161; 370/297; H04N 7/10, 7/14, 7/173

[56] References Cited

U.S. PATENT DOCUMENTS

| | | | |
|---|---|---|---|
| 4,397,037 | 8/1983 | Theriault | 455/188 |
| 4,963,966 | 10/1990 | Harney et al. | 358/349 |
| 5,130,664 | 7/1992 | Pavlic et al. | 330/55 |
| 5,379,141 | 1/1995 | Thompson et al. | 359/125 |
| 5,404,161 | 4/1995 | Douglass et al. | 348/1 |
| 5,425,027 | 6/1995 | Baran | 370/69.1 |
| 5,434,610 | 7/1995 | Loveless | 348/6 |
| 5,481,389 | 1/1996 | Pidgeon et al. | 359/161 |

OTHER PUBLICATIONS

Wideband High–Selectivity Diplexers Utilizing Digital Elliptic Filters, Robert J. Wenzel, I EEE Transactions on Microwave Theory and Techniques, vol. Mtt–15, No. 12, Dec. 1967, (pp. 669–679).

Designing the Return System for Full Digital Services, Dean A. Stoneback and William F. Beck, 1995, (pp. 269–277).

*Primary Examiner*—Mark R. Powell
*Assistant Examiner*—John W. Miller
*Attorney, Agent, or Firm*—Trapani & Molldrem

[57] ABSTRACT

A filter for controlling the return path loss in a multi-channel communication system having forward and return paths. The filter comprises a forward path filter network, and a return path filter network. The forward path network passes signals in the forward path, and includes at least one resonant circuit component, such as a capacitor, which is coupled to the return path network. The return path network passes signals in the return path, and includes at least one resonant circuit, such as a series LC trap to ground. A combined resonant circuit is formed, at least in part, by the resonant circuit of the return path network and the resonant circuit component of the forward path network (e.g., a combined series LC trap to ground). The return path network further includes an attenuator network which is designed to attenuate the signals in the return path frequency band. Preferably, the attenuator network is a resistive network which provides a predetermined amount of flat loss.

42 Claims, 13 Drawing Sheets

RETURN PATH FILTER

BACKGROUND OF THE INVENTION

1. Technical Field

The present invention relates generally to filters used in multi-channel communication systems such as two-way CATV cable systems. The present invention relates more particularly to multi-band filters for processing the multiple channels of such communication systems.

2. Background Art

In some multi-channel communication systems, its is desirable to selectively control the loss at several points in at least one of the channels of the system. One example of such a system is a community antenna television (CATV) system, having a two-way communication capability. In such a system, RF television program signals are transmitted from a headend to a subscriber end over a particular frequency band. This band is referred to as the forward (or downstream) path (or channel) of the CATV system. Other signals are transmitted from the subscriber end to the headend, or to some other upstream station. These other signals are transmitted in a different frequency band (higher and/or lower) than the forward path frequency band, and this different band is usually referred to as the return (or upstream) path (or channel) of the CATV system.

Coupled between the headend and subscriber end of the CATV system, there is a system of coaxial and/or optical cables. A typical cable system architecture includes a main trunk cable connected between the headend and a trunk/bridger station. One or more feeder cables feed off of the trunk/bridger station. Each feeder cable contains a number of taps disposed along the length of the feeder cable, and each tap contains a number of ports. A drop cable is connected between each port and a subscriber end. A television receiver is located at the subscriber end, and, for a system offering two-way communications, the subscriber end will also have a subscriber terminal device which transmits signals upstream, in the return path of the cable system.

Cable operating companies are now offering to their subscribers advanced communication services in the return path, including addressable converter operation, Pay Per View transactions, telephony, interactive digital networks, and computer data transmission. In order to offer such services in a reliable manner, certain problems in the return path must be addressed. For instance, many CATV cable systems are designed primarily for forward path operation. The loss (or attenuation) values of each tap are selected to provide proper signal levels at the drop cables, at forward path frequencies. The forward signal at each successive tap port is designed to have the same level at the highest design frequency. This insures a proper forward signal level to each subscriber.

Due to the forward tap design, the loss in the return path varies widely with every tap. This causes a corresponding variance in the signal levels in the return path. This variance in signal level imposes severe design constraints on subscriber terminal transmitters (e.g., set-top addressable converters), and adversely affects the ability of headend receivers to properly detect the return path signals. Significant improvements in the return path performance can be achieved by controlling the loss variance in the return path. If the loss at each tap port can be made substantially uniform, the total variance can be brought down to an acceptable level.

Another problem that must be addressed is interference (or "ingress") entering the return path at the subscriber end. Such interference is caused by radio frequency, electrical and electromagnetic sources, and enters the return path through damaged or insufficiently shielded subscriber drop cable, corroded "F" connectors, and internal subscriber wiring and hardware. As a result of the forward tap design, the taps contributing most to return path ingress are those having lower attenuation values (i.e., those taps at the distal end of the feeder cables).

An article by Dean A. Stoneback and William F. Beck, entitled "Designing the Return System for Full Digital Services", dated 1995, p. 269–71, (hereinafter "Stoneback Article"), suggests that by reducing the loss variance in the return path (i.e., equalizing or balancing the return path), ingress can be reduced to a manageable level. Thus, the Stoneback Article suggests that by addressing the loss variance problem, the ingress problem can be satisfactorily resolved in most cases.

A practical and effective approach to balancing the return path loss must satisfy several requirements. First, the devices used to balance the loss must be inexpensive because of the large number of such devices needed to be distributed throughout the CATV cable system. Second, the devices must be small and light weight, because such devices need to be deployed on cables, tap ports, within the taps themselves, inside network interface devices, in on-premise enclosures, pedestals, ground blocks, etc. In many applications, the device should be housed in a small cylindrical housing containing connectors at each end. Third, it is most desirable to leave unaffected the forward path response when employing the loss balancing devices. The loss chosen for the return path should be independent of the forward path response.

The Stoneback Article suggests two alternative methods of balancing the return path loss. The first is to employ a diplex filter with flat loss in the return band. The second method is to use an equalizer which covers the entire forward and return frequency bands. The diplex filter approach is discouraged by the Stoneback Article, because of the heretofore prevailing view that the device which adds flat loss in the return path is more difficult to manufacture.

Diplex filters have been used for processing both the forward and return paths in a CATV cable system. Examples of such use are disclosed in U.S. Pat. Nos: 5,434,610 to Loveless; 5,425,027 to Baran; 5,130,664 to Pavlic et al.; and 4,963,966 to Harney et al. The patents to Loveless and Pavlic show conventional circuit architectures for diplex filters employing flat loss. Such architectures employ a network of separately connected devices, each of which has a separate housing and associated connectors. Such assembled networks are more susceptible to interference pick-up than a singly packaged network. In addition, such architectures are too large and expensive for the CATV loss balancing application hereinabove described. Furthermore, as mentioned by the Stoneback Article, the flat loss device is more difficult to manufacture than an equalizer approach.

The use of equalization filters, as described in the Stoneback Article, also has drawbacks in the contemplated CATV loss balancing application. The forward path system architecture must be reconfigured, usually with an unfavorable reduction in system dynamic range performance. In addition, the loss chosen for the return path is not independent of the loss established in the forward path. Moreover, wideband (e.g., 5–750 MHz) equalization filters are more difficult to design and match than diplex filters. An example of a CATV system employing an equalizer, for the forward and return paths, is disclosed in U.S. Pat. No. 5,379,141 to Thompson et al.

Attempts have been made to design small, single housing, low cost diplex or "windowed" highpass filters for CATV forward and return path processing. However, as the circuit boards and housings for such filters become small, the spacing between filter components becomes close. With such close spacing, mutual coupling between inductors adversely affects the intended performance of the filter. Attempts to solve this problem have included the use of (i) shielding between inductors, (ii) compartments which divide the filter network into separate shielded segments, and (iii) compensation circuits or components. Such solutions are not advantageous in the contemplated CATV application because they add significantly to the cost and size of the filter product.

Attempts to decrease the size and cost of diplex or "windowed" highpass filters for CATV applications have included efforts to reduce the number of components in the filter. However, such efforts have not been fully explored, because the prevailing view has been that simple, low order filters will not yield satisfactory performance over the wide frequency band of interest in CATV applications. Attempts to improve such performance, short of increasing the complexity of the filter, has heretofore led to an increase in cost and/or size of the filter.

Ferrite core inductors have been used in diplex or "windowed" highpass filters for CATV applications because of their low cost and compact design. However, ferrite core inductors are more affected by mutual coupling than other types of inductors, including air-core inductors. Thus, in a small housing, the problem of mutual coupling is more severe with ferrite core inductors. One technique for compensating for the mutual coupling between inductors is to tune at least one of the inductors in the circuit. However, compact ferrite core inductors are fixed value components (i.e., their inductance values are not adjustable). Thus, compensation by inductance tuning has not, heretofore, been considered available in these circuits. Very small tunable inductors are available today; however, they are prohibitively expensive for the CATV application contemplated herein.

When using ferrite core inductors, the value of inductance for each inductor in the filter becomes critical. Likewise, the values of the other filter components (e.g., capacitors) also become critical. Without a tuning capability, the designs for the CATV diplex and windowed highpass filters have tended to require non-standard values for inductors and capacitors. This requirement, especially for capacitors, increases the overall cost of such filters. If the ferrite core inductors, used in these filters, could somehow be made tunable, their precise inductance values would not be critical, and standard-value (low cost) capacitors could be used in the design.

OBJECTS AND SUMMARY OF THE INVENTION

It is therefore an object of the present invention to provide apparatus and methods that avoid the aforementioned problems associated with the prior art.

It is another object of the present invention to selectively control the loss at several points in at least one channel of a multi-channel communication system.

It is a further object of the present invention to equalize the return path signal loss for all subscribers in a multi-channel CATV system.

It is still another object of the present invention to reduce the interference (or "ingress") entering the return path of the CATV system without disturbing forward path performance.

It is still a further object of the present invention to provide a multi-band filter, for a CATV system, containing a predetermined amount of flat loss in the return path band.

It is still a further object of the present invention to provide a multi-band filter, for a CATV system, which introduces flat loss in the return path band that is independent of any loss in the forward path band.

It is yet another object of the present invention to provide a filter for controlling the return path loss in a multi-channel CATV system, wherein the values of the reactive filter components remain the same for a wide range of flat loss values selected for such filter.

It is yet a further object of the present invention to provide a filter for controlling the return path loss in a multi-channel CATV system, the cost of which makes it economically feasible to employ such filters throughout the CATV cable system.

It is yet still another object of the present invention to provide a filter for controlling the return path loss in a multi-channel CATV system, which is sufficiently small and light weight such that it can be deployed on cables, tap ports, within the taps themselves, inside network interface devices, in on-premise enclosures, pedestals, ground blocks, etc.

It is yet still a further object of the present invention to provide a filter for controlling the return path loss in a multi-channel CATV system, which is relatively easy to design and manufacture.

It is yet still another object of the present invention to provide a filter for controlling the return path loss in a multi-channel CATV system, which is enclosed in a single filter housing.

It is yet still a further object of the present invention to provide methods of utilizing the mutual coupling between inductors to tune a filter for controlling the return path loss in a multi-channel CATV system.

It is yet still another object of the present invention to provide methods of making a filter for controlling the return path loss in a multi-channel CATV system, which allows for use of standard values for at least the capacitors in such filter.

It is yet still a further object of the present invention to provide a filter apparatus for controlling the return path loss in a multi-channel CATV system, which yields satisfactory performance over the frequency band of interest with a minimum number of filter components.

It is yet still another object of the present invention to provide a "windowed" highpass filter having a predetermined amount of flat loss in the windowed passband, for controlling the return path loss in a multi-channel CATV system.

These and other objects are attained in accordance with the present invention, wherein there is provided a filter apparatus for controlling the return path loss in a multi-channel communication system having a forward path and a return path. The filter apparatus comprises an input terminal and an output terminal, a forward path filter network, and a return path filter network. The forward path network is coupled to the input/output terminals and to ground, and functions to pass signals in the forward path of the communication system. The forward path network includes at least one resonant circuit component, such as a capacitor, which is coupled to the return path network.

The return path network is also coupled to the input/output terminals and to ground, and functions to pass signals in the return path of the communication system. The return path network includes at least one resonant circuit, such as a series LC trap to ground, which is coupled to the resonant circuit component (e.g., capacitor) of the forward path network. A combined resonant circuit is formed, at least in part, by the resonant circuit of the return path network and the resonant circuit component of the forward path network (e.g., a combined series LC trap to ground).

The return path network further includes an attenuator network which is designed to attenuate the signals in the return path frequency band, as they pass through the return path network. Preferably, the attenuator network is a resistive network which provides a predetermined amount of flat loss. The amount of flat loss (or attenuation) may be fixed in steps of, for example, 3 dB or 5 dB, in a range from 3 dB to about 36 dB.

The filter apparatus of the present invention may also comprise an AC power bypass circuit coupled to the attenuator network. The power bypass circuit is employed to pass an AC power signal (being transmitted over the cable) around the attenuator network. The filter apparatus may further comprise an equalization circuit coupled to the return path network. The equalization circuit is employed to compensate for the frequency response slope of the CATV cable, in the return path frequency band. This is accomplished by altering, in a complementary way, the frequency response of the return path filter network.

In one particular embodiment, the filter apparatus of the present invention is enclosed in a housing having an interior volume of less than about 5 cubic inches. Preferably, the housing has a tubular shape with a length not exceeding about 80 mm and a diameter not exceeding about 25 mm.

In the preferred embodiment of the filter apparatus of the present invention, a number of the inductors are ferrite core inductors. The effective inductance of each ferrite core inductor is dependent upon its position relative to at least one other inductor in the filter apparatus, and upon its position relative to the housing. Generally, the effective inductances of the ferrite core inductors are less than the specified inductance values for such inductors.

A method of tuning the filter apparatus of the present invention has been devised which takes advantage of the mutual coupling properties of ferrite core inductors. In this method, an inductance value of the ferrite core inductor is first determined for the filter network in which the inductor is to operate. Then, the ferrite core inductor is mounted in the filter network, and its position is adjusted until the effective inductance of the inductor is substantially equal to the initially determined inductance value.

A method of making a filter apparatus of the present invention, utilizing at least one ferrite core inductor, comprises the steps of: (a) selecting values for the capacitors of the filter apparatus; (b) determining an inductance value for the ferrite core inductor based on at least one of the capacitance values selected in step (a); (c) selecting a specified inductance for the ferrite core inductor that is greater than the inductance value determined in step (b); (d) assembling the filter apparatus; and (e) adjusting the position of the ferrite core inductor in the filter apparatus until its effective inductance is substantially equal to the inductance value determined in step (b). Step (a) may include selecting standard values for the capacitors, and step (c) may include selecting a specified inductance for the ferrite core inductor that is about 10-15% greater than the inductance value determined in step (b).

In an other embodiment of the present invention, the filter apparatus comprises a "windowed" highpass filter and an attenuator network coupled to the windowed highpass filter.

The windowed highpass filter has a highpass filter passband which passes signals in the forward path, and has a bandpass filter passband (or window) which passes signals in the return path. The attenuator network attenuates the window of the windowed highpass filter by a predetermined amount such that the signals passing through the window are attenuated thereby.

BRIEF DESCRIPTION OF THE DRAWING

Further objects of the present invention will become apparent from the following description of the preferred embodiments with reference to the accompanying drawing, in which.

DETAILED DESCRIPTION OF THE PREFERRED EMBODIMENTS

Figure 1:
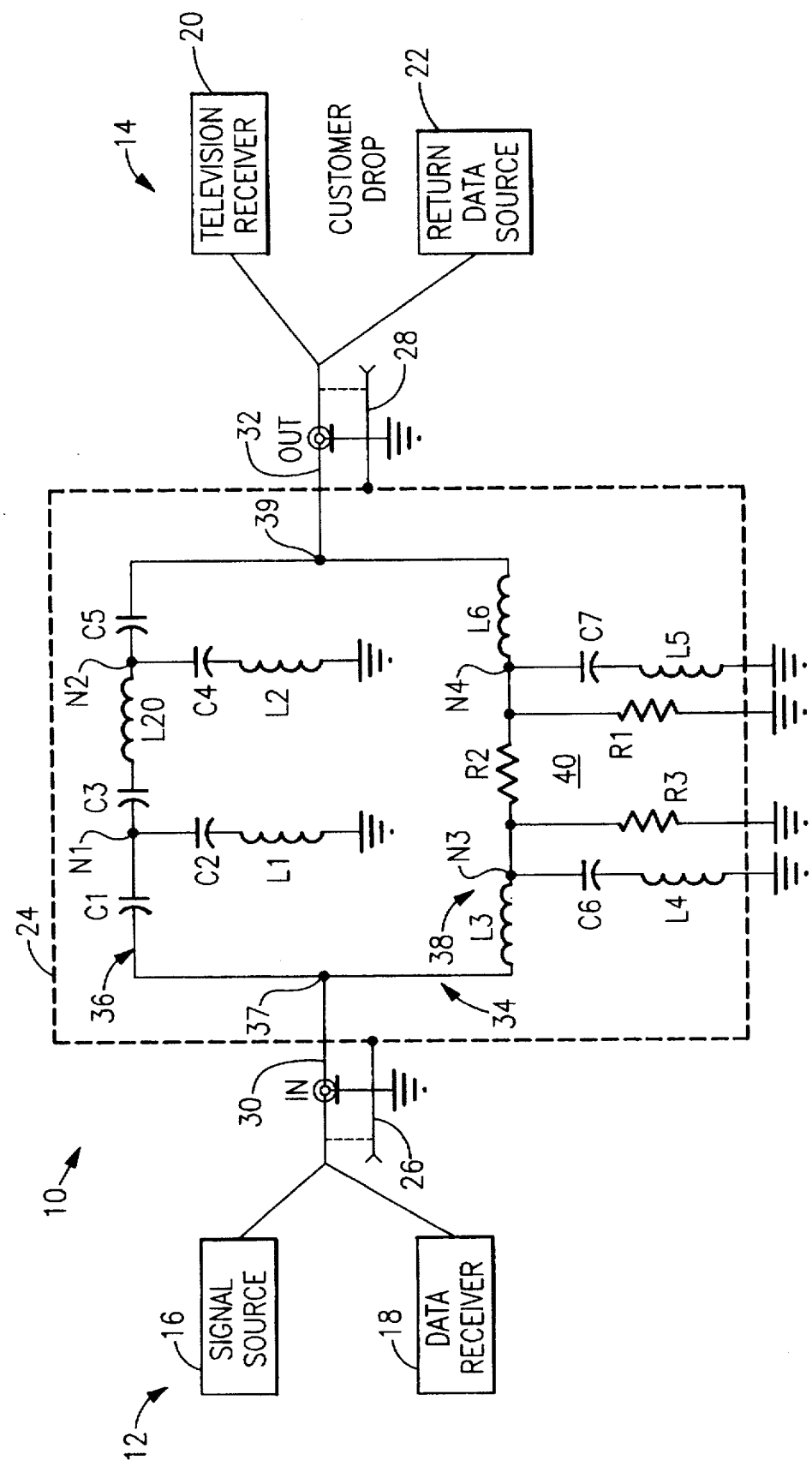
FIG. 1 is a schematic diagram of a first embodiment of the filter apparatus of the present invention, which includes a resistive "PI" attenuator network.

With reference to FIG. 1, there is shown a schematic diagram of a first embodiment of the present invention. A filter apparatus 10 is constructed in accordance with the present invention for controlling the return path loss in a multi-channel CATV cable system. The CATV system has a headend 12 and a number of subscriber ends 14. Headend 12 contains a headend transmitter 16 for transmitting RF television program signals in a forward path frequency band (e.g., 50–1000 MHz), and a headend receiver 18 for receiving signals from subscriber end 14 in a return path frequency band (e.g., 5–40 MHz). Signals from subscriber end 14 may include, for example, impulse Pay return signals, addressable converter signals, Pay Per View signals, and telephone voice/data signals. At subscriber end 14, a television receiver 20 is coupled to the CATV system for receiving the RF television program signals. A subscriber terminal 22 (e.g., a set-top addressable converter) is also coupled to the CATV system for transmitting and receiving signals in the return path frequency band.

In FIG. 1, filter apparatus 10 is shown containing a housing 24 which includes an input connector 26 and an output connector 28. An input terminal 30 extends into connector 26 and an output terminal 32 extends into connector 28. A passive filter network 34 is mounted inside housing 24, and is connected to input terminal 30, output terminal 32, and to ground. Network 34 includes a forward path filter network 36 and a return path filter network 38. Filter network 36 is coupled to input terminal 30 at a node 37 and to output terminal 32 at a node 39. Filter network 38 is also coupled to input terminal 30 at node 37 and to output terminal 32 at node 39.

Figure 14:
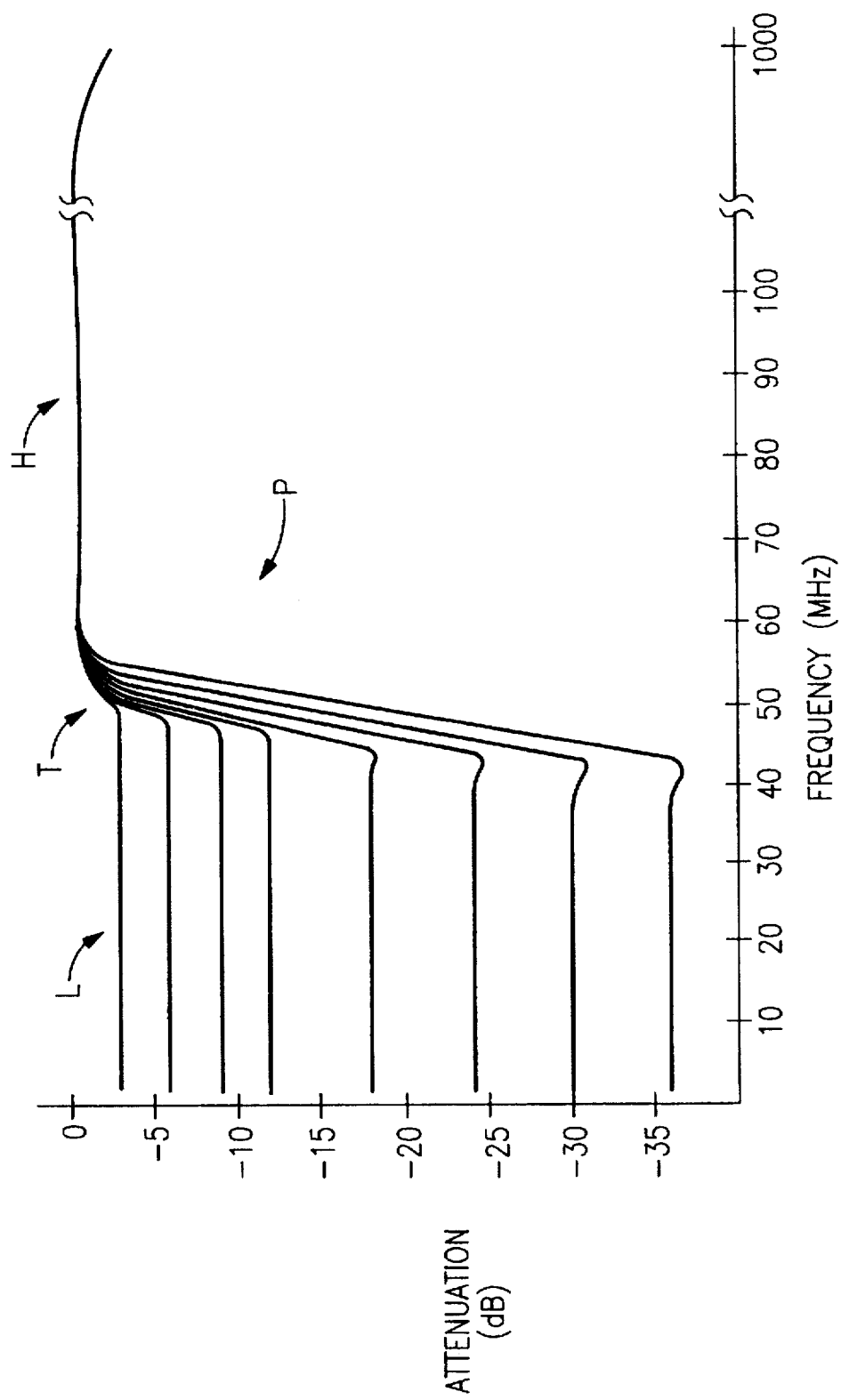
FIG. 14 is a diagram of frequency response plots of the first embodiment of the present invention, for different attenuation values ranging from 3 dB to 36 dB.

Forward path network 36 is essentially configured as a highpass, elliptic function, filter having a well-defined passband from about 50 MHz to about 1000 MHz (See FIG. 14). This "highpass" passband allows RF television program signals to pass through filter apparatus 10 virtually unimpeded, in the forward path frequency band. The return path network 38 is essentially configured as a lowpass, elliptic function, filter with one very important distinction—a resistive attenuator network 40 has replaced a series inductor. Network 38 has a well-defined "lowpass" passband from about 1 MHz to about 41 MHz (See FIG. 14). As a result of attenuator network 40, the lowpass passband allows return path signals to pass through filter apparatus 10, attenuated by a predetermined (or stepped) amount of flat loss (i.e., frequency independent attenuation). Network 38 attenuates signals in the forward path frequency band, and such attenuation is both frequency dependent (i.e., the stopband response of network 38) and frequency independent (i.e., the flat loss contributed by attenuator network 40). Thus, the isolation between forward path and return path processing is improved (over a conventional diplex filter) by the attenuation contributed by network 40.

Filter network 34 is a tuned passive filter. As shown in FIG. 1, highpass network 36 includes: a series capacitor C1 coupled between input terminal 30 and a node N1; a tuned series capacitor/inductor branch C2/L1 connected between node N1 and ground; a series capacitor/inductor branch C3/L20 connected between node N1 and a node N2; another tuned series capacitor/inductor branch C4/L2 connected between node N2 and ground; and a series capacitor C5 coupled between node N2 and output terminal 32. L20 is included in network 36 to compensate for any stray capacitance produced by potting material used in the final assembly of filter apparatus 10.

As shown in FIG. 1, lowpass network 38 includes: a series inductor L3 coupled between input terminal 30 and a node N3; a tuned series capacitor/inductor branch C6/L4 connected between node N3 and ground; attenuator network 40, which is a 75 ohm matched attenuator configured as a two terminal "PI" network of resistors R1/R2/R3; another tuned series capacitor/inductor branch C7/L5 connected between a node N4 and ground; and a final series inductor L6 coupled between node N4 and terminal 32.

In operation, highpass network 36 actually has four poles contributing to its frequency response. Tuned branches C2/L1 and C4/L2 are resonant circuits establishing two poles at particular frequencies below the passband of highpass network 36 (e.g., 28 MHz and 35 MHz respectively). Capacitor C1 and inductor L3 combine in series with capacitor/inductor branch C6/L4, as a combined resonant circuit, to establish the third pole below the passband of network 36 (e.g., 38 MHz). Capacitor C5 and inductor L6 combine in series with capacitor/inductor branch C7/L5, as a combined resonant circuit, to establish the fourth pole below the passband of network 36 (e.g., 41 MHz). Lowpass network 38 has two poles contributing to its frequency response. Branches C6/L4 and C7/L5 are resonant circuits establishing two poles at particular frequencies above the passband of lowpass network 38 (e.g., 55 MHz and 60 MHz respectively).

The combined resonant circuits (i.e., C1/L3/C6/L4 and C5/L6/C7/L5) are realized in filter network 34 because of the presence of attenuator network 40 between circuits C6/L4 and C7/L5. If network 40 is replaced with an inductor between nodes 3 and 4, as in a diplex filter, the combined resonant circuits would not form, and the two additional poles would not be created (i.e., the frequency response of highpass network 36 would be defined by only two poles instead of four). The two additional poles in network 36 effects an unexpected and significant improvement in the overall frequency response of filter network 34. In comparison to a diplex filter of the same order, filter network 34 has a more defined (i.e., sharper) transition region between the highpass and lowpass regions. In addition, the transition region is more narrow (i.e., steeper) than in the diplex filter (e.g., by about 5 MHz) and, as a result, the band reject response of highpass network 36 is extended upward in frequency. Moreover, the attenuation in the band reject response of highpass network 36, near the transition region, is increased (e.g., by about 7 dB). Thus, filter network 34 achieves significantly improved frequency response performance without having to increase the order or complexity of the filter network. This is due to the sharing of components between highpass and lowpass networks 36 and 38. The number of filter components is maintained low while achieving improved performance.

The amount of flat loss introduced in the return path by attenuator network 40 can range from about 3 dB to about 36 dB (See FIG. 14). FIG. 14 shows a family of frequency response plots P of filter network 34, for several different values of flat loss introduced by network 40. Each plot includes a lowpass region L, a transition region T, and a highpass region H. The values of the LC components in network 34 remain the same over the 3 dB to 36 dB range of attenuation. As shown in FIG. 14, transition region T remains well behaved over the range of attenuation values.

In addition an unexpected improvement in frequency response, the ratio of reflection loss to insertion loss in the return path of filter network 34 is unexpectedly high. The insertion loss is about 1 dB and the reflection loss is about 20 dB. A greater insertion loss for filter network 34 would have been expected.

Filter network 34 is based on an initial design for a set of complimentary lowpass/highpass 5th order elliptic function filters. Passband ripple and stopband attenuation were chosen at 0.04 and −27 dB respectively. After joining the filters for diplex operation, the mid-point lowpass series inductance was removed and replaced by attenuator network 40. A circuit optimization program (e.g., the EESOF Touchstone® program) was used to modify element values in a manner that would permit a single set of reactive components to accommodate a range of 0–30 dB in return path loss, while maintaining a −20 dB reflection loss across the entire RF spectrum.

Figure 2:
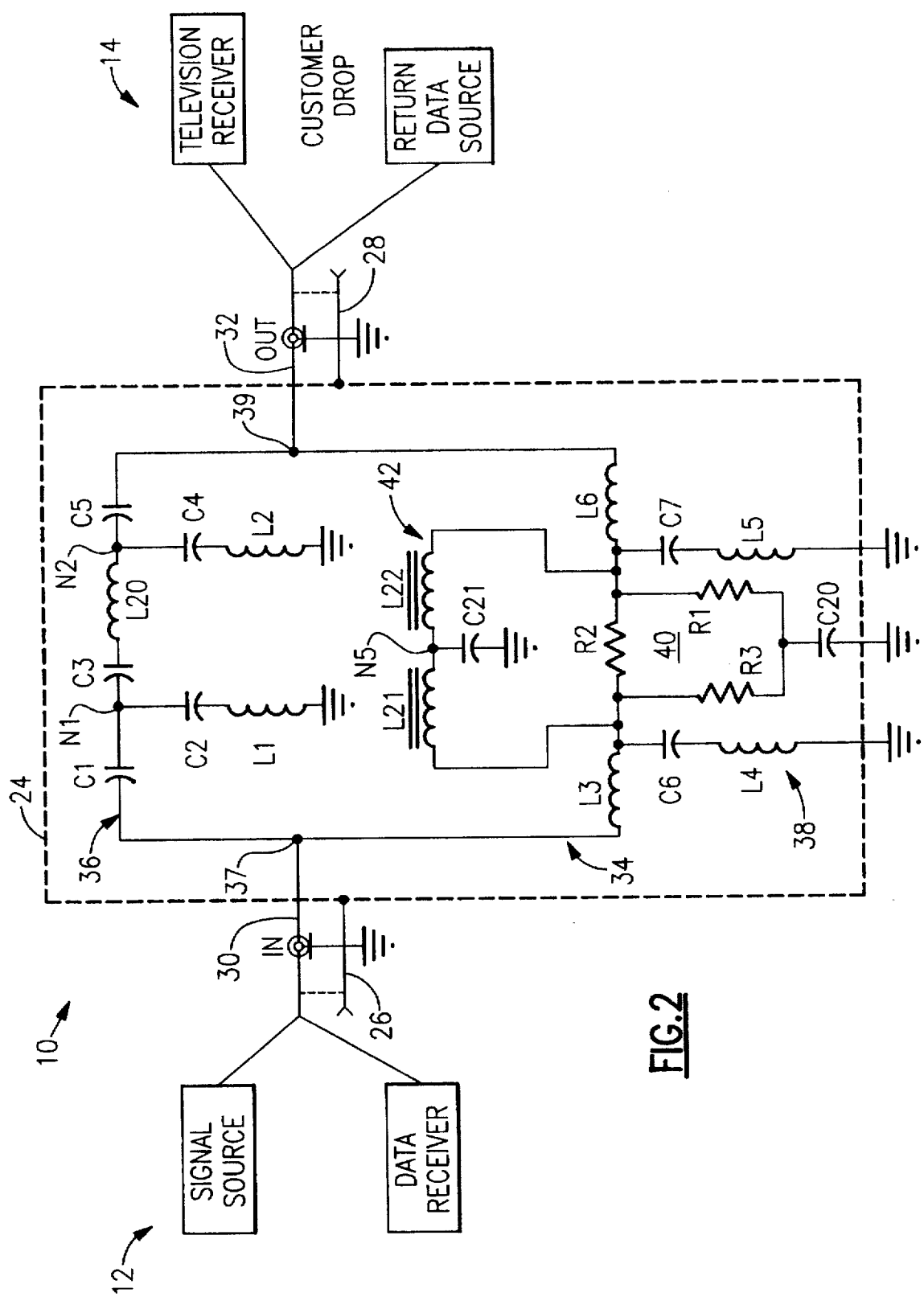
FIG. 2 is a schematic diagram of a second embodiment of the filter apparatus of the present invention, which includes an AC power by-pass circuit coupled to the resistive attenuator network.

Second, third, fourth and fifth embodiments of filter apparatus 10 are shown in FIGS. 2–5, respectively. Like characters of reference designate like parts throughout FIGS. 1–5. As shown in FIG. 2, the second embodiment of filter apparatus 10 is identical to the first embodiment except for the addition of an AC power by-pass circuit 42 connected across network 40, and a blocking capacitor C20 connected between network 40 and ground. By-pass circuit 42 functions to rout AC power around network 40. By-pass circuit 42 includes two series connected RF chokes L21 and L22 (e.g., 10–15 micro henries), and a shunting capacitor C21 connected between a node N5 and ground. Capacitor C21 has a relatively high value of capacitance (e.g., 0.1 micro farads), and functions to ground all RF signals in the CATV forward path frequency band. The inductance of RF chokes L21 and L22 and the capacitance of capacitor C21 are selected such that there is no resonance or anti-resonance at any frequency in or near the forward path frequency band. Capacitor C20 functions to protect attenuator network 40 from high AC power currents.

Figure 3:
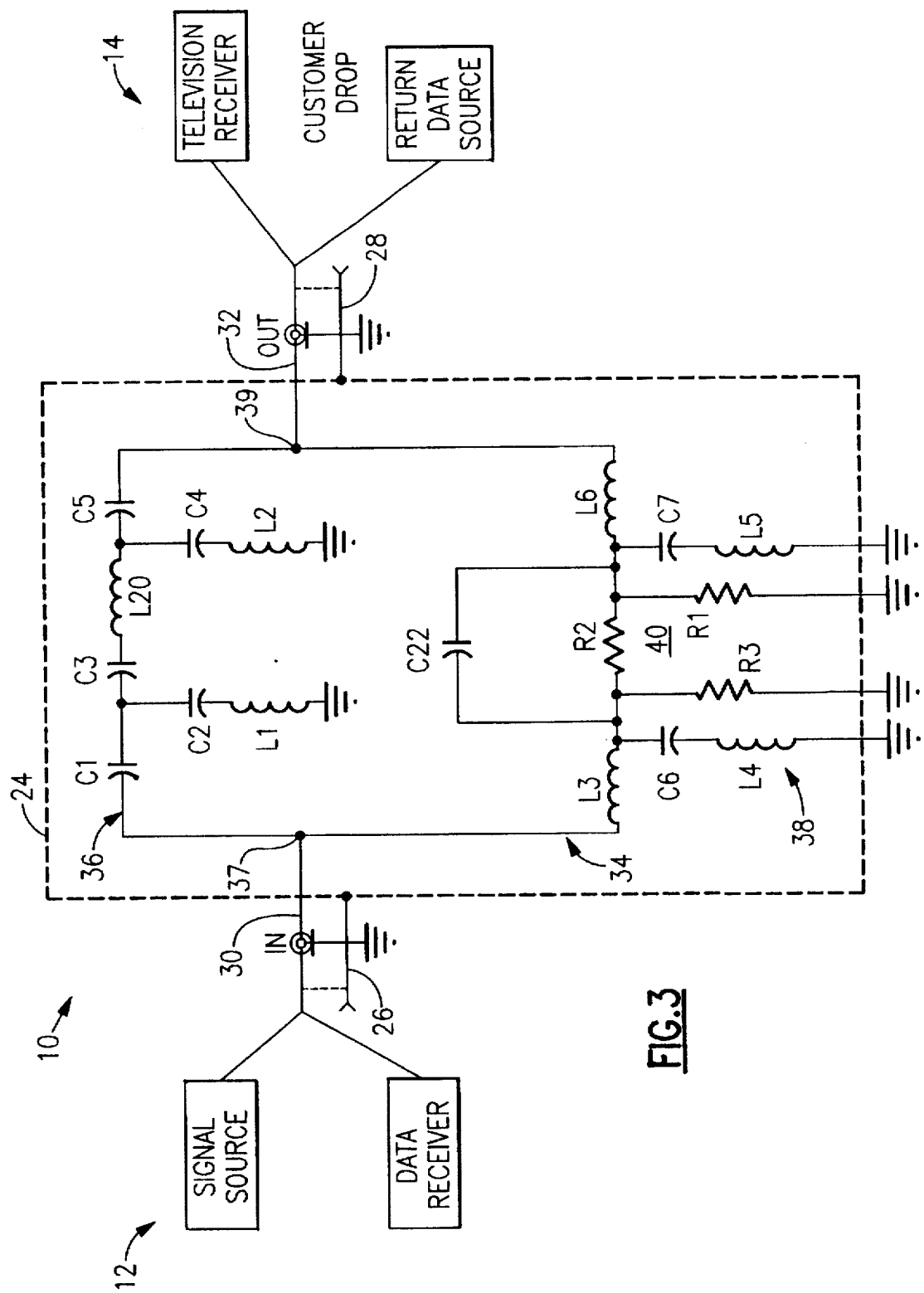
FIG. 3 is a schematic diagram of a third embodiment of the filter of the present invention, which includes an equalizing circuit that compensates for cable frequency response slope.

Referring now to FIG. 3, there is shown a schematic diagram of the third embodiment of filter apparatus 10. This embodiment is identical to the first embodiment except for the addition of an equalizing capacitor C22 connected across network 40. Typically, a CATV coaxial cable has a slope in its frequency response. This slope is typically 2–2.5 dB up to 50 MHz, and 10 dB over 750 MHz. Capacitor C22 functions to alter the frequency response of lowpass network 38 such that the altered response substantially complements the cable slope. Thus, the cable slope, in the return path frequency band, is substantially compensated by the addition of capacitor C22.

Figure 4:
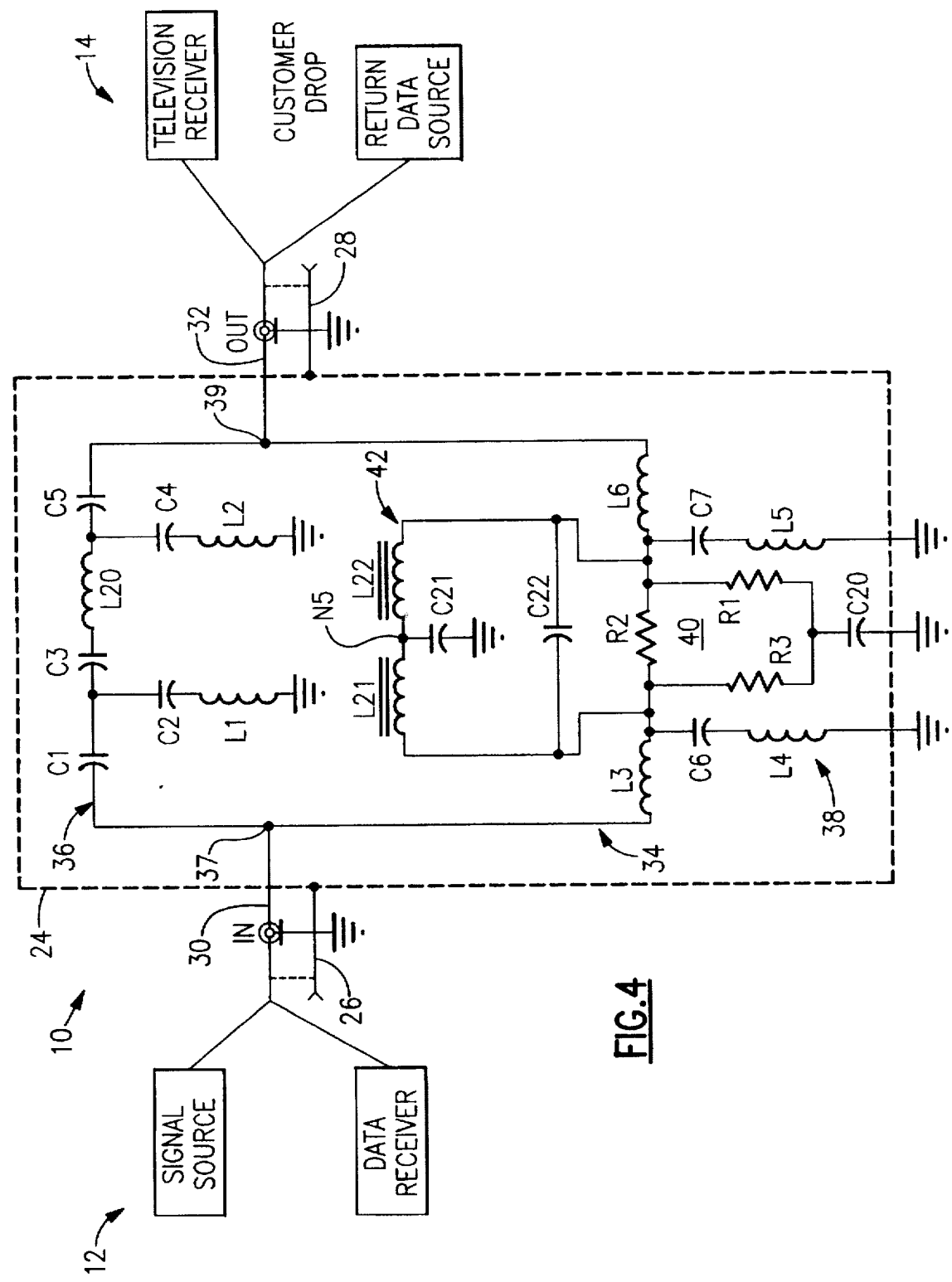
FIG. 4 is a schematic diagram of a fourth embodiment of the filter apparatus of the present invention, which includes both the AC power by-passing circuit of FIG. 2 and the equalization circuit of FIG. 3.

Referring now to FIG. 4, there is shown a schematic diagram of the fourth embodiment of filter apparatus 10. This embodiment is identical to the first embodiment except that it has both by-pass circuit 42 (with blocking cap C20) and equalizing capacitor C22. These circuits have been described above with reference to FIGS. 2 and 3.

Figure 5:
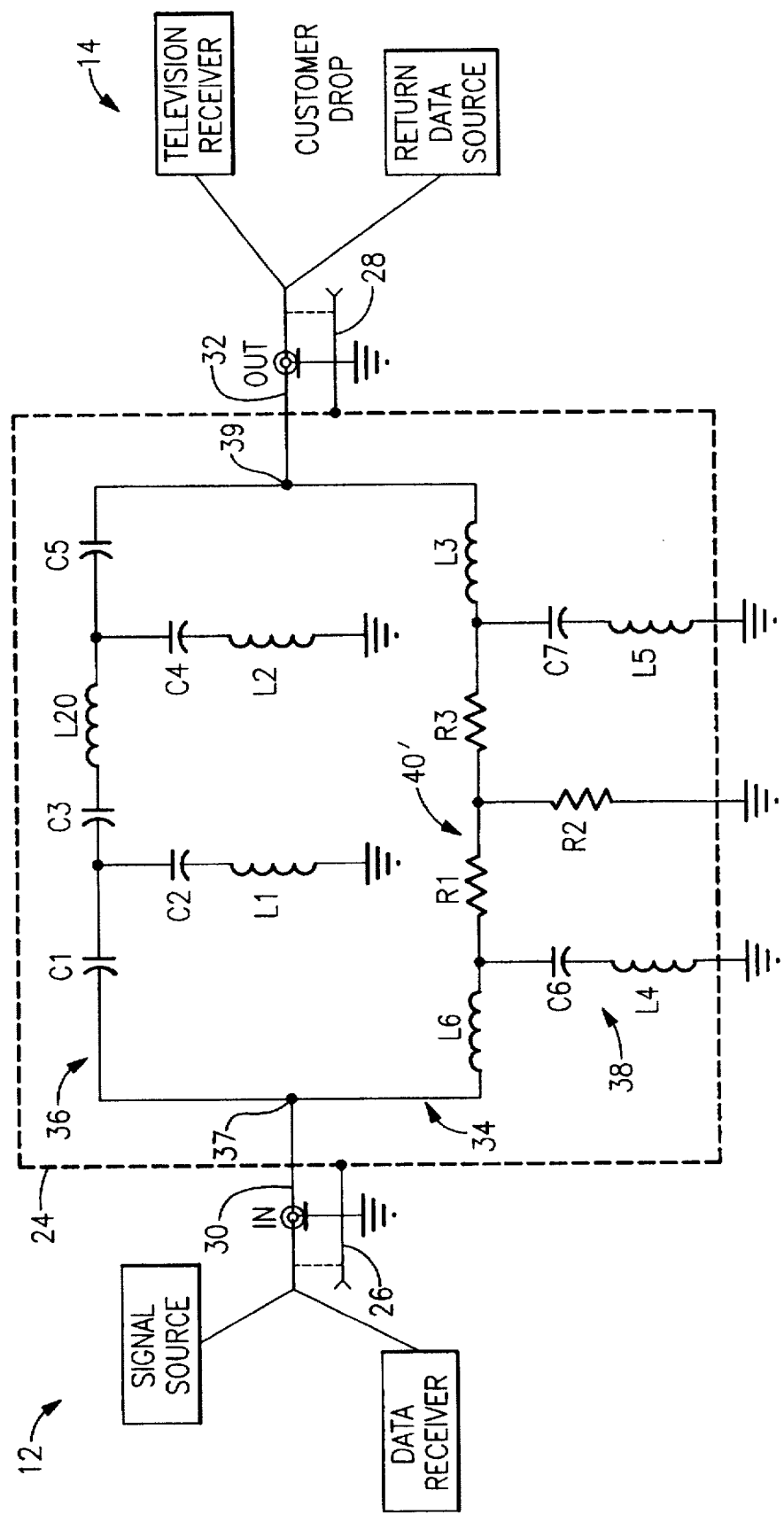
FIG. 5 is a schematic diagram of a fifth embodiment of the filter apparatus of the present invention, which includes a resistive "TEE" attenuator network.

Referring now to FIG. 5, there is shown a schematic diagram of the fifth embodiment of filter apparatus 10. This embodiment is identical to the first embodiment except that attenuator network 40, arranged as a resistive "PI" network, is replaced with an attenuator network 40' arranged as a resistive "TEE" network (R1,R2,R3).

Figure 6:
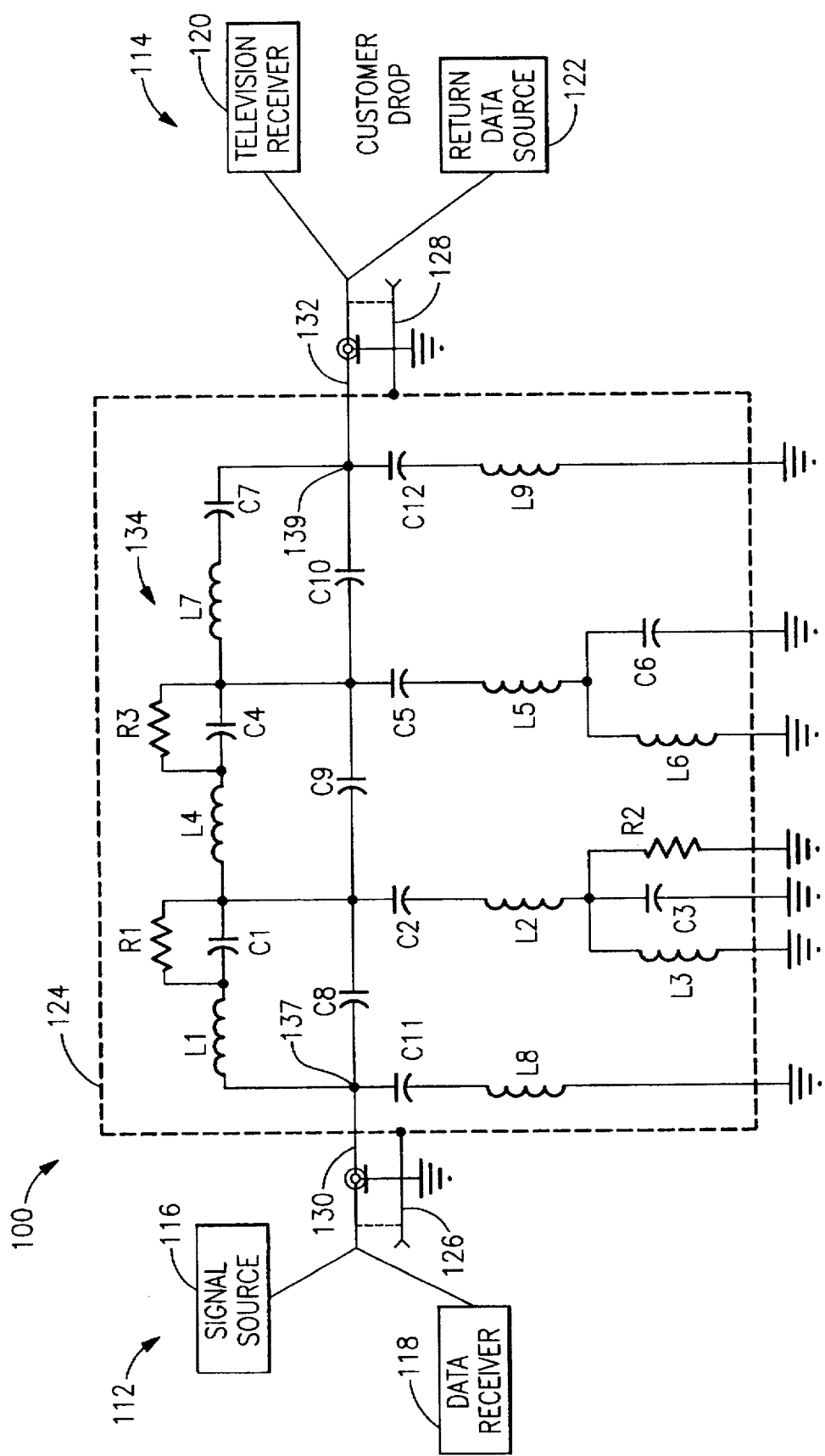
FIG. 6 is a schematic diagram of a sixth embodiment of the filter apparatus of the present invention, including a windowed highpass filter with resistive attenuation in the return path window.

Referring now to FIG. 6, there is shown a sixth embodiment of the present invention. A filter apparatus 100, like apparatus 10, is designed to control the return path loss in a multi-channel communication system, such as a CATV system. Filter apparatus 100 is connected to a CATV cable system having a headend 112 and a number of subscriber ends 114. Headend 112 contains a headend transmitter 116 and a headend receiver 118. At subscriber end 114, a television receiver 120 and a subscriber terminal 122 are coupled to the CATV system. Filter 100 contains a housing 124 which includes an input connector 126 and an output connector 128. An input terminal 130 extends into connector 126 and an output terminal 132 extends into connector 128.

Figure 15:
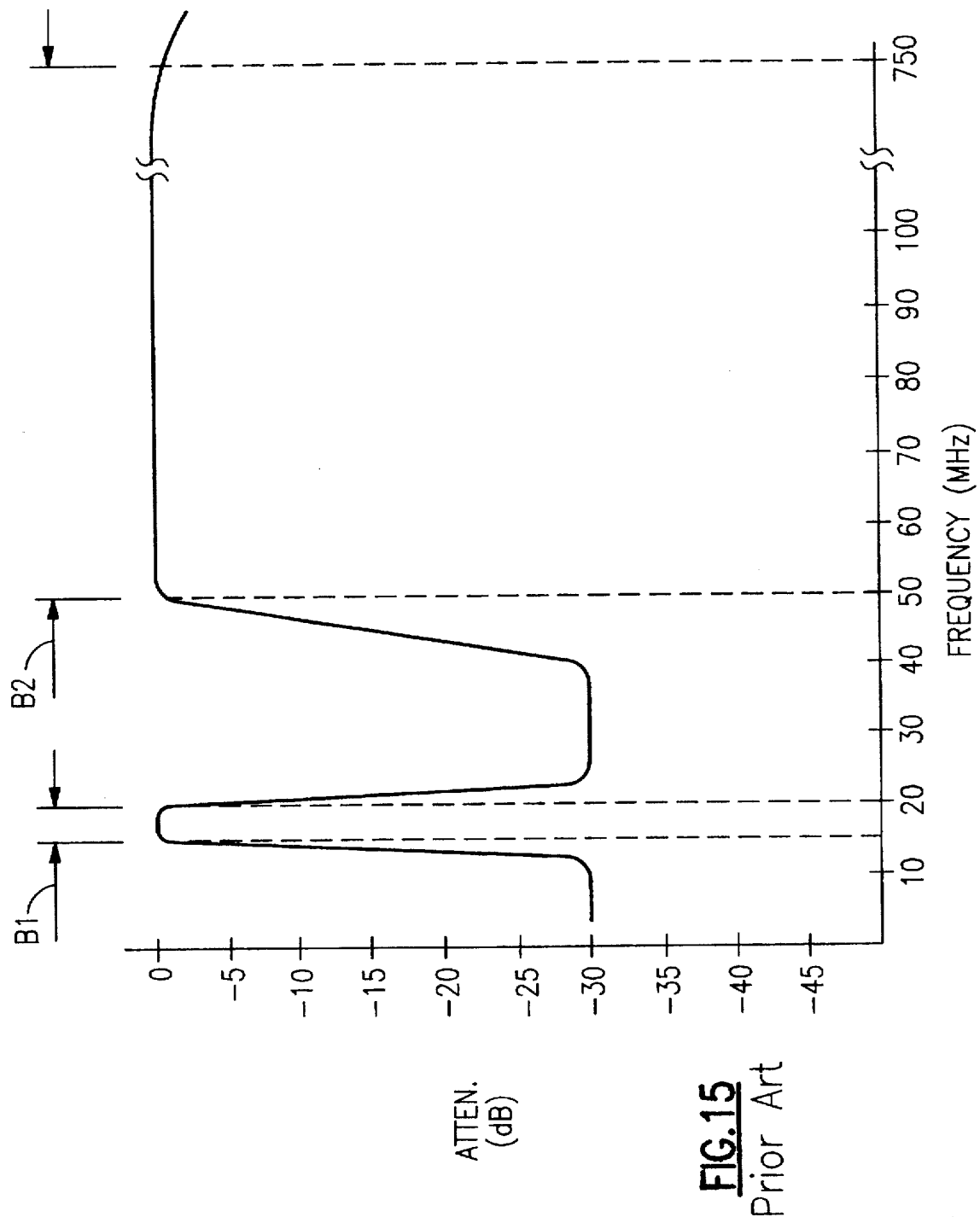
FIG. 15 a frequency response plot of a conventional windowed highpass filter.

With further reference to FIG. 6, filter apparatus 100 includes a filter network 134 mounted inside housing 124. Network 134 is connected to input terminal 130, output terminal 132, and to ground. Filter network 134 has a frequency response resembling that of a "windowed" highpass filter. A windowed highpass filter is a multi-band filter having at least a highpass filter passband and a bandpass filter passband. An example of a windowed highpass filter response is shown in FIG. 15. The filter response includes a passband (or "window") B1 and a passband B2. Window B1 is a bandpass filter response occupying the spectrum between 15–20 MHz. Passband B2 is a highpass filter response occupying the spectrum between 50–750 MHz.

Referring back to FIG. 6, filter network 134 can be viewed as comprising a bandpass network and a highpass network. The bandpass network includes inductors L1–L7 and capacitors C1–C7, connected as shown in FIG. 6. The highpass network includes capacitors C8–C10, connected as shown in FIG. 6. Both bandpass and highpass networks are connected to terminals 130 and 132 at nodes 137 and 139 respectively. Filter network 134 also includes an input trap consisting of capacitor C11 and inductor L8, and an output trap consisting of capacitor C12 and inductor L9, both connected as shown in FIG. 6.

Figure 16A:
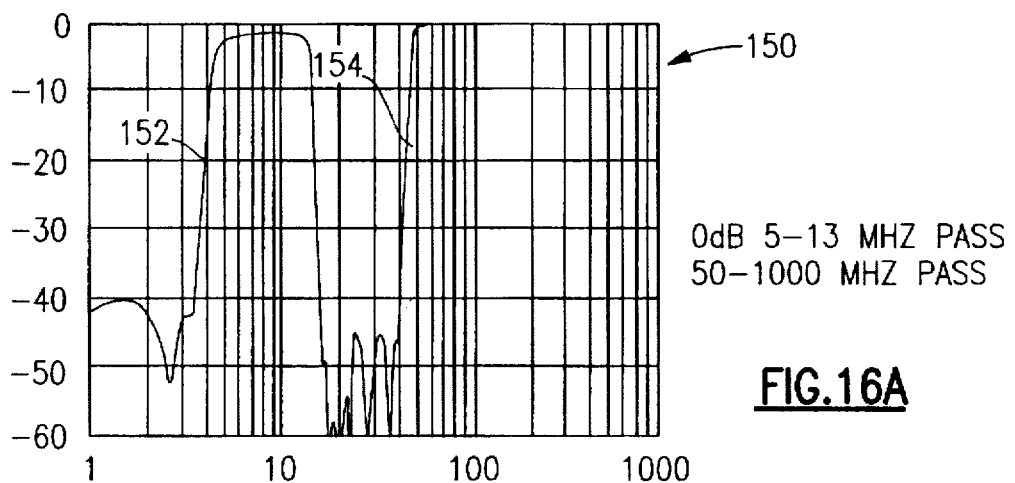
FIGS. 16A-16C are a series of frequency response plots of the sixth embodiment of the present invention, showing 0, 6 and 12 dB, respectively, of attenuation in the return path window.

Filter network 134, as thus far described, is a novel windowed highpass filter network, having a frequency response 150 as shown in FIG. 16A. Frequency response 150 includes a window 152 occupying the spectrum between 5–13 MHz, and a highpass passband 154 occupying the spectrum between 50–1,000 MHz. Like network 34 of the first embodiment, network 134 also experiences improved performance from the sharing of components between the highpass network (C8,C9,C10) and the bandpass network (L1–L7, C1–C7). Very good band suppression is achieved between passbands 152 and 154, in part, because of three additional poles created by the following three "mutual" circuits (See FIG. 6): (1) series inductor L1 and capacitor C1 in parallel with capacitor C8; (2) series inductor L4 and capacitor C4 in parallel with capacitor C9; and (3) series inductor L7 and capacitor C7 in parallel with capacitor C10. The performance achieved by network 134 is significantly greater than expected for the level of complexity of the network. This performance improvement is a result of the three additional poles created by the shared components.

As shown in FIG. 6, filter network 134 also includes resistors R1, R2 and R3 connected across capacitors C1, C3 and C4, respectively. These resistors introduce a predetermined amount of attenuation in window band 152, such that signals in the window band are attenuated by the predetermined amount. The values of resistors R1, R2 and R3 may range, for example, between 10–1,000 ohms. In one example, where 10 dB of attenuation was introduced in the window band, R1 equaled 68 ohms, R2 equaled 62 ohms, and R3 equaled 470 ohms.

Figure 16B:
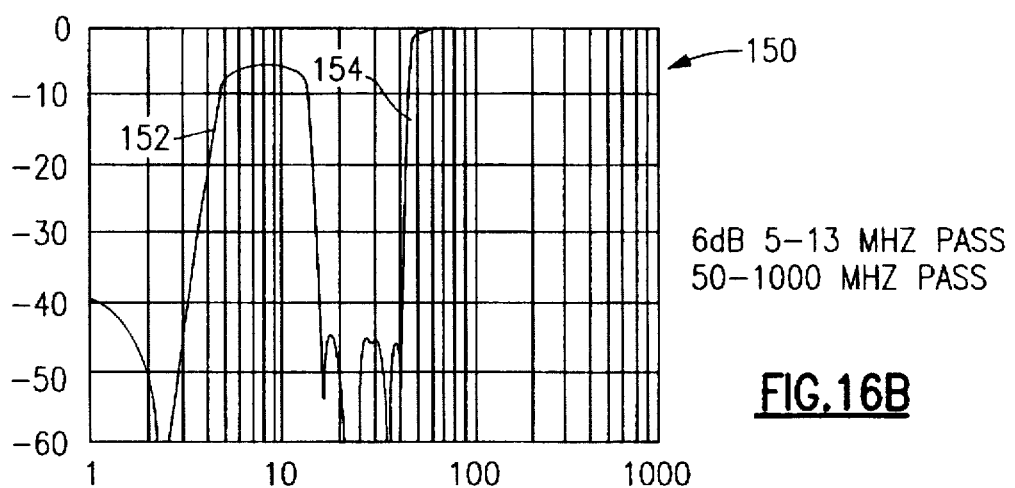
Figure 16C:
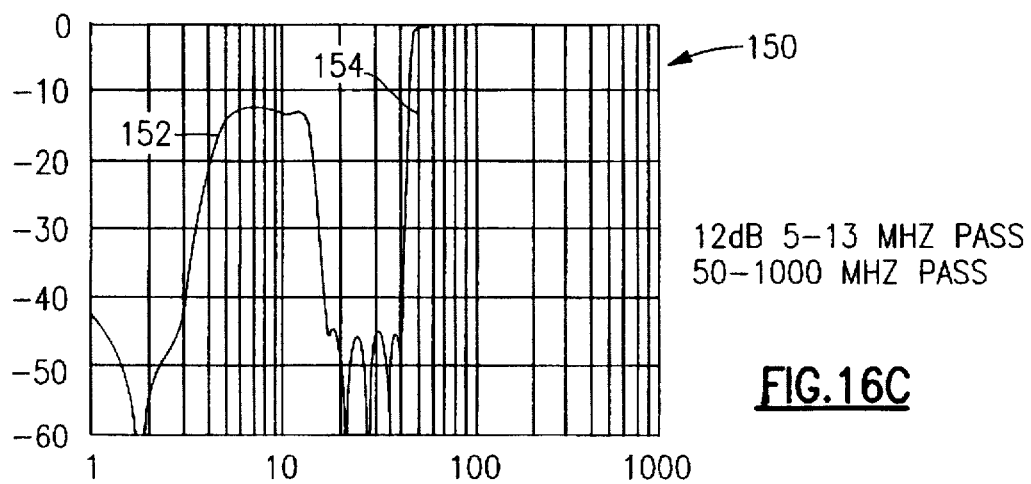

FIGS. 16B and 16C show two examples of frequency response 150 being altered by resistors R1, R2 and R3. In FIG. 16B, window 152 is attenuated by about 6 dB, and the values of resistors R1, R2 and R3 are 62 ohms, 100 ohms, and 2200 ohms, respectively. In FIG. 16C, window 152 is attenuated by about 12 dB, and the values of resistors R1, R2 and R3 are 68 ohms, 43 ohms, and 330 ohms, respectively.

Like filer 10, filter 100 may be used to control the return path loss in a CATV system. This application will be described hereinbelow with reference to FIGS. 7A and 7B. In a CATV system, highpass response 154 of network 134 allows RF television program signals, transmitted by headend transmitter 116 in the forward path, to pass unimpeded through filter 100, and be received by television receiver 120 (FIG. 6). Window response 152 of network 134 allows subscriber signals, transmitted from terminal transmitter 122 in the return path, to pass through filter 100, attenuated by a predetermined amount (e.g., 6 dB, 12 dB, etc.).

Figure 7A:
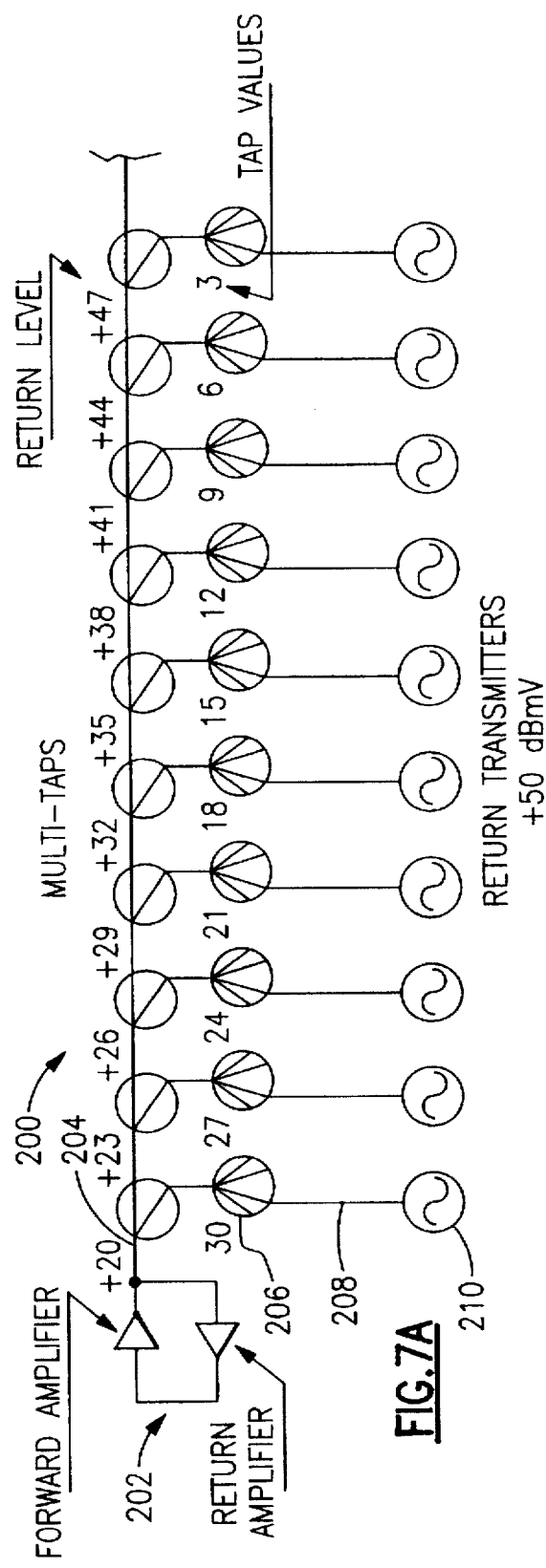
FIGS. 7A and 7B are simplified diagrams of a CATV cable system showing a comparison between unequalized (FIG. 7A) and equalized (FIG. 7B) loss in the return path, wherein equalization in FIG. 7B is achieved using filter apparatus of the present invention.
Figure 7B:
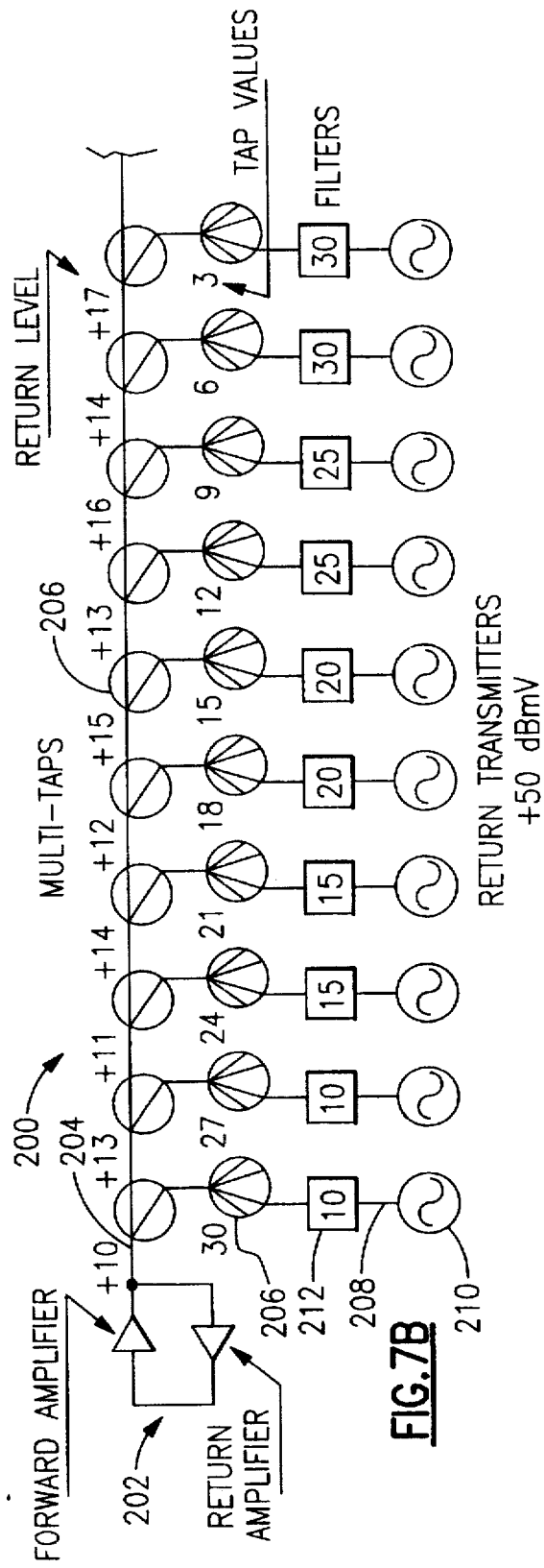

FIGS. 7A and 7B illustrate how either filter 10 or filter 100 can be used to control the return path loss in a CATV cable system. As shown in FIGS. 7A and 7B, a cable system branch 200 includes an amplifier station 202 connected between the headend of the CATV system and a feeder cable 204. Feeder 204 includes a number of taps 206, and each of the taps includes four tap ports. A drop cable 208 is connected between a tap port of each tap 206 and a subscriber location. At each subscriber location, there is a television receiver (not shown) and a subscriber terminal transmitter 210, both coupled to drop cable 208. In this example, transmitters 210 transmit subscriber signals in the return path, at a gain level of +50 dBmV. The attenuation (in dB) introduced by each tap 206 is noted adjacent to the tap. The variation of attenuation values in taps 206 are due to the forward path design of feeder cable 204 (See discussion above in the Background of the Invention).

In FIG. 7A, as subscriber signals are transmitted upstream from transmitter 210, the 50 dB signal level is attenuated by tap 206, resulting in a return level in feeder 204. The return level is noted at each tap in FIG. 7A. In the example of FIG. 7A, the maximum variation in return levels of the subscriber signals is 27 dB, which imposes severe constraints on the CATV system (See discussion above in Background of the Invention).

In FIG. 7B, a filter 212, corresponding to either apparatus 10 or apparatus 100, has been installed at each active tap port. Filter 212 introduces a specified amount of attenuation in the return path while leaving the forward path unchanged. The amount of attenuation (in dB) is noted on each filter 212 in FIG. 7B. The attenuation introduced by filters 212 substantially balances or equalizes the return level variation. The return levels are noted adjacent to each tap 206 in FIG. 7B. In this example, the maximum variation in return levels is only 7 dB, which is small enough to avoid the problems normally associated with an unequalized return path. In addition to equalization, filters 212 also reduce ingress entering at the drop cables and subscriber locations.

Figure 8:
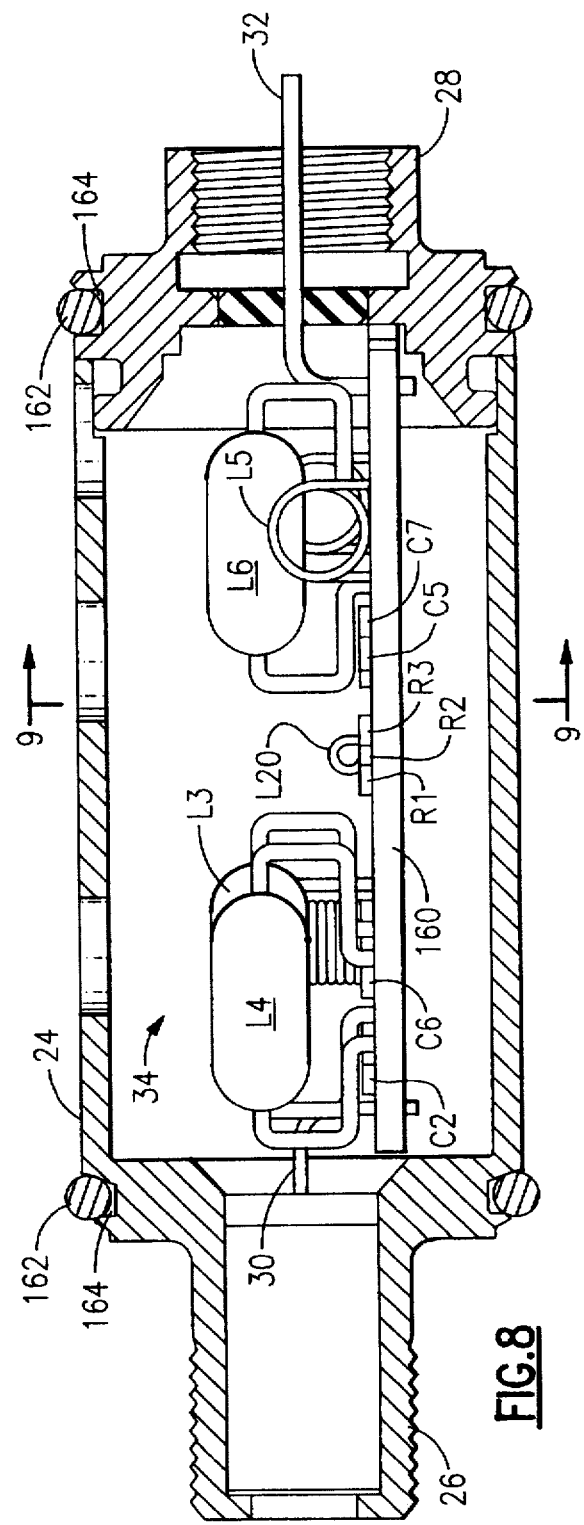
FIG. 8 is a side sectional view of the construction of the first embodiment of the present invention.

The general construction of filter apparatus 10 and 100 will now be described with reference to FIGS. 8–10. FIG. 8 is a side view of filter apparatus 10, showing housing 24 in section and filter network 34 intact. The construction of housing 24 is well known in the CATV filter industry. Connector 26 and connector (or "filter cap") 28 form part of housing 24. A printed circuit board 160 is mounted, in the usual manner, in housing 24. Filter network 34 is assembled on circuit board 160. Housing 24 may also include a pair of o-rings 162 seated in a pair of circumferential grooves 164, respectively, around housing 24. A sleeve (not shown) may be slipped over housing 24 and made to engage o-rings 160 to effect a seal around housing 24. As indicated in FIGS. 8–10, the shape of housing 24 is cylindrical.

It is important that filter apparatus 10 be made as small and light as possible to accommodate the variety of installation options (e.g., at the tap port, inside the tap, inside a network interface device, in on-premise enclosures, pedestals, ground blocks, etc.). For CATV system applications, the housing should have an interior volume of less than about 5 cubic inches. Preferably, the cylindrical housing shown in FIGS. 8–10 should have a length not exceeding about 80 mm and a diameter not exceeding about 25 mm. FIG. 10 shows the typical component layout of network 34 on circuit board 160. Filter apparatus 100 is constructed similarly, in the same small filter housing as shown in FIGS. 8–10.

Figure 9:
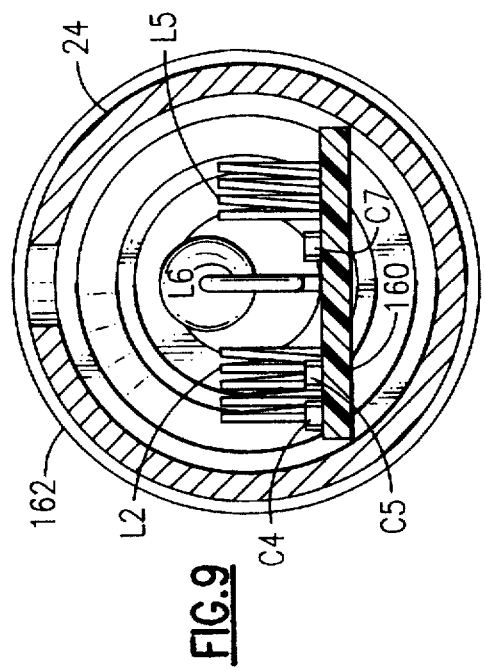
FIG. 9 is a cross sectional view of the filter construction of FIG. 8, taken along line 9—9 in FIG.8.
Figure 10:
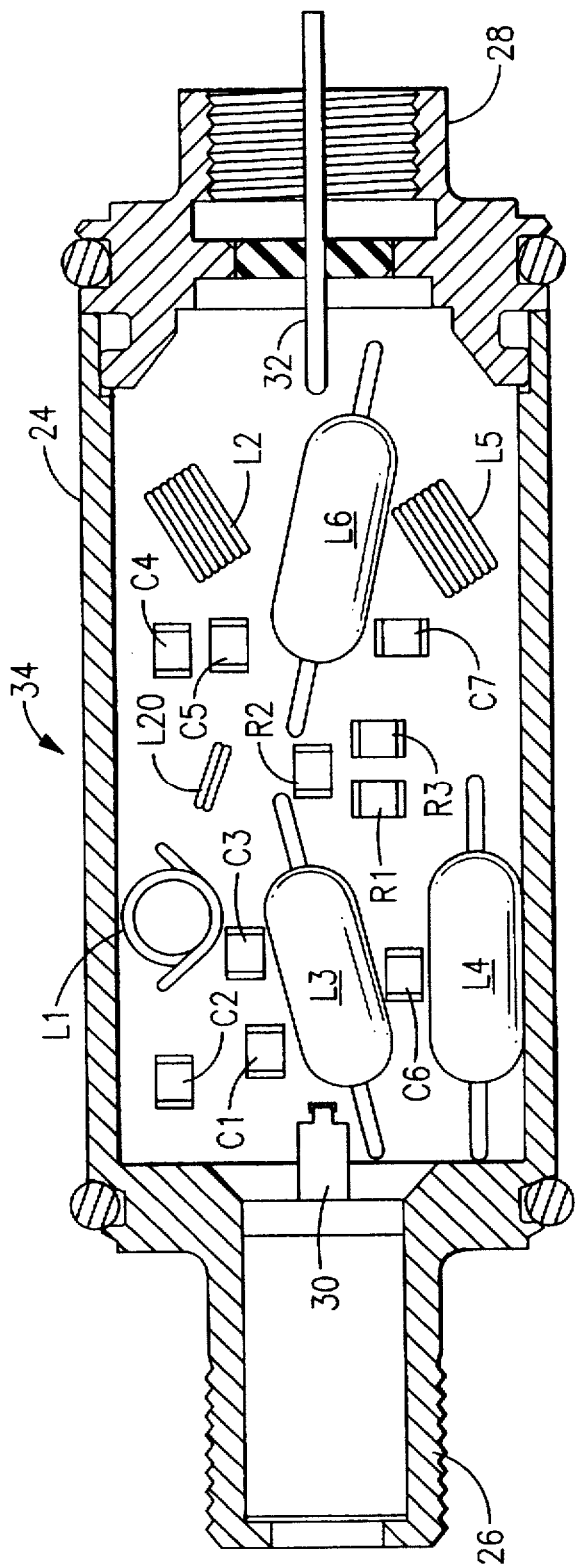
FIG. 10 is a top sectional view of the filter construction of FIG. 8, showing the printed circuit board component layout.

For many CATV system applications, filter apparatus 10 may be packaged in a housing like housing 24 shown in FIGS. 8–10. Housing 24 is preferably made of metal. However, for some applications, the housing may be made of plastic and take on any shape suitable for the application. For example, if filter apparatus 10 is to be installed at the tap port, the preferred housing should be made of metal and configured like housing 24. If filter apparatus 10 is to be installed inside the tap, the housing may be made of plastic and be rectangular in shape.

Figure 11:
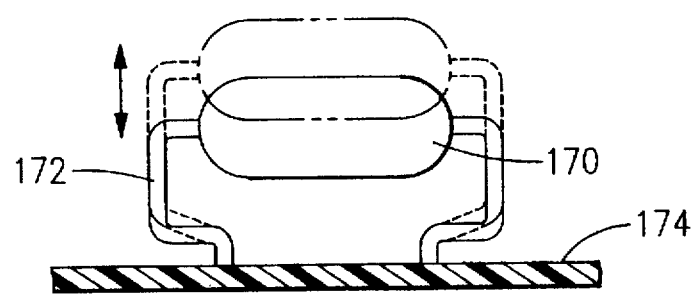
FIGS. 11-13 are a series of diagrammatic sketches illustrating a method of positional tuning of ferrite core inductors.

In the preferred embodiment of filter apparatus 10 and 100, for CATV cable system applications, all filter components (e.g., inductors and capacitors) are non-tunable (i.e., fixed-value) components. In addition, some of the inductors used in the filter networks are ferrite core inductors. For instance, in filter apparatus 10, inductors L3, L4 and L6 are Ferrite DR Core inductors with leads pre-formed as best shown in FIGS. 8 and 11. Fixed-value components and ferrite core inductors are chosen for apparatus 10 and 100 because these types of components are generally smaller and cheaper than their tunable counterparts. However, as discussed above in the Background of the Invention, the use of fixed-value components and ferrite core inductors can make the manufacture of filters difficult. It is an object of the present invention to overcome these difficulties by employing a novel method of positional tuning of the ferrite core inductors.

The positional tuning method of the present invention will now be described with reference to FIGS. 10–13. This method is based on the principle that ferrite core inductors are very sensitive to inductive coupling. The position of a ferrite core inductor relative to another inductor (ferrite core or other type), or to a metal housing containing the inductor, will significantly alter the effective inductance of that ferrite inductor in the circuit in which it operates. It has been found that the effective inductances of ferrite core inductors, in networks 34 and 134, are consistently less than the inductances specified for those inductors. As a result of these properties, a method has been devised to effectively tune a ferrite core inductor in the circuit, by adjusting the position of the inductor.

Figure 12:
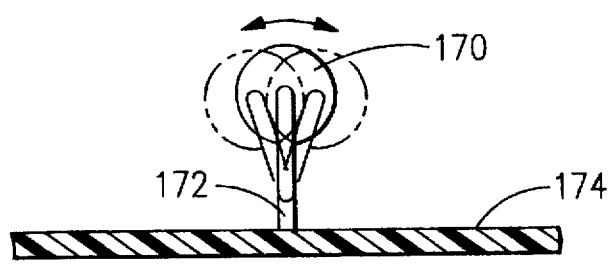
Figure 13:
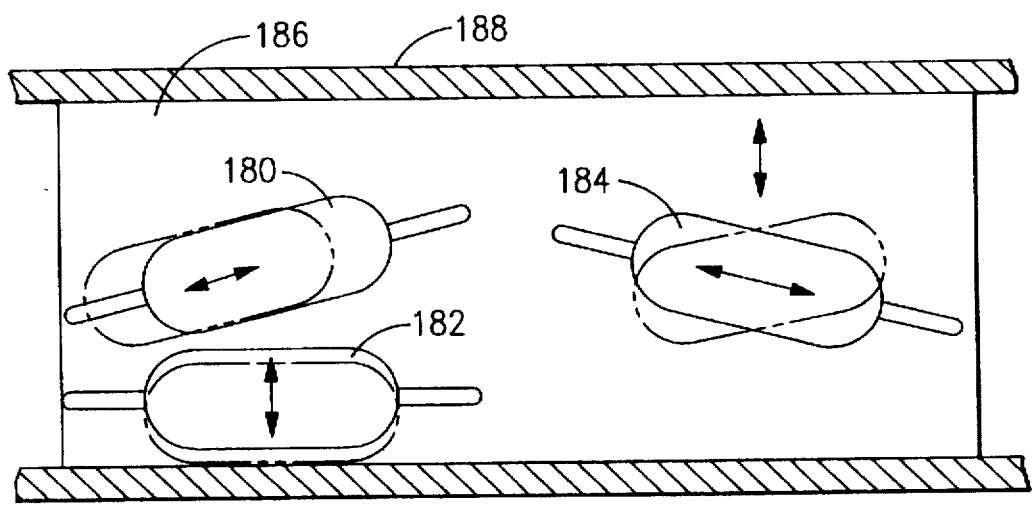

FIGS. 11–13 illustrate different ways in which a ferrite core inductor can be adjusted. As shown in FIG. 11, a ferrite core inductor 170, having preformed leads 172, is mounted on a circuit board 174. The position of inductor 170 is adjusted upward (or downward). In FIG. 12, the position of inductor 170 is pivoted sideways, in either direction, about leads 172. In FIG. 13, ferrite core inductors 180, 182 and 184 are mounted on a circuit board 186 which is, in turn, mounted in a housing 188. Inductor 180 is tuned, for example, by adjusting its position forwards and backwards. Inductor 182 is tuned, for example, by adjusting its position towards and away from housing 188. Inductor 184 is tuned, for example, by adjusting its position torsionally.

A method of tuning network 34 (FIG. 10) by positional tuning, for example, ferrite inductor L3, will now be described. First, the correct inductance value for inductor L3, in network 34, is calculated or otherwise determined (e.g., iterative computer program). Second, a ferrite core inductor is selected for L3, having a specified inductance greater than the value determined in the first step. The specified value should be about 10-15% greater than the determined value. Then, the selected inductor is mounted in network 34 as L3, and its position is adjusted until its effective inductance is substantially equal to the determined inductance value for L3.

As mentioned above in the Background of the Invention, further cost reductions for apparatus 10 or 100, can be achieved if standard capacitor values are used. Such capacitors are readily available and cheap. A method of making filter network 34 using standard capacitor values will now be described. First, standard capacitance values for the capacitors in network 34 are selected. Second, the inductance values for the inductors in network 34 are calculated or otherwise determined. Third, ferrite core inductors are selected for L3, L4 and L6, having specified inductances about 10-15% greater than the values determined for L3, L4 and L6, in the second step. Fourth, the selected ferrite core inductors (and the other inductors for network 34) are then mounted on circuit board 160, in network 34. Fifth, the positions of the ferrite core inductors are adjusted until their effective inductances are substantially equal to the determined inductance values for L3, L4 and L6.

Once network 34 is complete, the mechanical assembly of filter 10 is performed, including the injection of potting material into the housing to hold the circuit components in place and protect them from mechanical shock and the environment.

While the preferred embodiments of the invention have been particularly described in the specification and illustrated in the drawing, it should be understood that the invention is not so limited. Many modifications, equivalents, and adaptations of the invention will become apparent to those skilled in the art without departing from the spirit and scope of the invention as defined in the appended claims.

What is claimed is:

1. An apparatus for controlling the return path loss in a two-way communication system, said apparatus comprising:

an input terminal and an output terminal;

forward path filter means, coupled to said input and said output terminals, for passing signals in a forward path frequency band of the communication system, said forward path filter means including a resonant circuit component; and return path filter means, coupled to said input and said output terminals, for passing signals in a return path frequency band of the communication system, said return path filter means including a resonant circuit which is coupled to the resonant circuit component of said forward path filter means, a combined resonant circuit being formed, at least in part, by the resonant circuit of said return path filter means and the resonant circuit component of said forward path filter means, said return path filter means further including attenuator means for attenuating the signals in the return path frequency band as they pass through said return path filter means.

2. The apparatus as recited in claim 1, wherein said forward path filter means is a highpass filter which has a passband containing the forward path frequency band of the communication system.

3. The apparatus as recited in claim 1, wherein said return path filter means is a lowpass filter which has a passband containing the return path frequency band of the communication system.

4. The apparatus as recited in claim 1, wherein the attenuator means of said return path filter means is a resistive network.

5. The apparatus as recited in claim 1, wherein the combined resonant circuit forms a pole at a frequency below the forward path frequency band.

6. The apparatus as recited in claim 1, wherein said return path filter means has input and output resonant circuits, and said attenuator means is coupled between the input and the output resonant circuits.

7. The apparatus as recited in claim 1, wherein the attenuation of said attenuator means is in the range of from about 3 dB to about 35 dB.

8. The apparatus as recited in claim 1, wherein said return path filter means attenuates signals in the forward path frequency band, the attenuation in the forward path frequency band having a frequency dependent component and a frequency independent component, said frequency independent component being supplied by the attenuation means.

9. The apparatus as recited in claim 1, wherein the resonant circuit component of said forward path filter means is a capacitor connected at one end to said input terminal, and the resonant circuit of said return path filter means includes a series capacitance and inductance circuit coupled between said input terminal and ground.

10. The apparatus as recited in claim 1, further comprising power bypass means, coupled to the attenuation means of said return path filter means, for passing a power signal around the attenuation means.

11. The apparatus as recited in claim 1, further comprising equalization means, coupled to said return path filter means, for altering the frequency response of said return path filter means such that it substantially compensates for the frequency response slope, in the return path frequency band, of a cable to which said apparatus is to be coupled.

12. A passive filter for controlling the return path loss in a communication system having a forward path and a return path, said filter comprising:

a housing having an interior volume of less than about 5 cubic inches;

a first terminal and a second terminal;

a first passive filter network, mounted inside said housing and coupled to said first and said second terminals and to ground, said first filter network having a passband which passes signals in the forward path of the communication system and a stop band which attenuates signals in the return path of the communication system;

a second passive filter network, mounted inside said housing and coupled to said first and said second terminals and to ground, said second filter network having a passband which passes signals in the return path of the communication system and a stop band which attenuates signals in the forward path of the communication system, said second filter network further including a passive attenuator network which attenuates signals in the return path of the communication system as the signals pass through said second filter network.

13. The passive filter as recited in claim 12, wherein said first filter network is a highpass filter.

14. The passive filter as recited in claim 12, wherein said second filter network is a lowpass filter.

15. The passive filter as recited in claim 12, wherein the passive attenuator network is a resistive network.

16. The passive filter as recited in claim 12, wherein the attenuation of the passive attenuator network is substantially constant in the return path of the communication system, and is fixed in the range of from about 3 dB to about 35 dB.

17. The passive filter as recited in claim 12, further comprising power bypass means, coupled to the passive attenuator network, for passing a power signal around the attenuator network.

18. The passive filter as recited in claim 12, further comprising equalization means, coupled to said second filter network, for altering the frequency response of said second filter means such that it substantially compensates, at least in the return path, for the frequency response slope of a cable channel to which said passive filter is to be coupled.

19. The passive filter as recited in claim 12, wherein said housing has a tubular shape with a length not exceeding about 80 mm and a diameter not exceeding about 25 mm.

20. The passive filter as recited in claim 12, wherein said first and said second filter networks each include an inductor and a capacitor, the inductors and capacitors being fixed-value components.

21. The passive filter as recited in claim 20, wherein at least one of the inductors is a ferrite core inductor.

22. The passive filter as recited in claim 21, wherein the effective inductance of said at least one ferrite core inductor is dependent upon its position relative to at least one other inductor in the passive filter.

23. The passive filter as recited in claim 22, wherein the effective inductance of said at least one ferrite core inductor is further dependent upon its position relative to said housing.

24. The passive filter as recited in claim 22, wherein the effective inductance of said at least one ferrite core inductor is less than the specified inductance for said inductor.

25. A method of tuning the passive filter of claim 22, wherein an inductance value of said at least one ferrite core inductor has been determined for the filter network in which said inductor is to operate, said method comprising step of:

adjusting the position of said at least one ferrite core inductor in said passive filter until the effective inductance of said at least one ferrite core inductor is substantially equal to said determined inductance value.

26. A method of making the passive filter of claim 22, comprising the steps of:

(a) selecting capacitance values for the capacitors of the passive filter;

(b) determining an inductance value for said at least one ferrite core inductor based on at least one of the capacitance values selected in step (a);

(c) selecting a specified inductance for said at least one ferrite core inductor that is greater than the inductance value determined in step (b);

(d) assembling the passive filter; and (e) adjusting the position of said at least one ferrite inductor in said passive filter until the effective inductance of said at least one ferrite inductor is substantially equal to the inductance value determined in step (b).

27. The method of claim 26, wherein said step (a) includes selecting standard capacitance values for the capacitors of the passive filter.

28. The method of claim 26, wherein said step (c) includes selecting a specified inductance for said at least one ferrite core inductor that is from about 10% to about 15% greater than the inductance value determined in step (b).

29. An apparatus for controlling the return path loss in a communication system having a forward path and a return path, said apparatus comprising:

a windowed highpass filter having a highpass passband which passes signals in the forward path and a bandpass passband or window which passes signals in the return path; and attenuator means, coupled to said windowed highpass filter, for attenuating the window of said windowed highpass filter by a predetermined amount, such that the signals passing through the window are attenuated thereby.

30. The apparatus as recited in claim 29, wherein the communication system is a cable television system having a headend and a subscriber end, the signals in the forward path being RF television programming signals transmitted from the headend, and the signals in the return path being signals transmitted from the subscriber end.

31. The apparatus as recited in claim 29, wherein said attenuator means includes at least one resistor.

32. The apparatus as recited in claim 29, wherein the window of said windowed highpass filter is realized from a network of capacitors and inductors, and said attenuator means includes at least one resistor connected across one of the capacitors.

33. The apparatus as recited in claim 29, wherein the window of said windowed highpass filter is realized from a network of capacitors and inductors, and said attenuator means includes a plurality of resistors connected across a corresponding plurality of the capacitors, respectively, of said windowed highpass filter.

34. The apparatus as recited in claim 29, wherein the predetermined amount of attenuation of said attenuator means is substantially constant in the return path frequency band and is fixed in the range of from about 6 dB to about 12 dB.

35. A method of controlling the return path loss in a communication system having a forward path and a return path, said method comprising the steps of:

(a) passing signals in the forward path of the communication system through a highpass filter passband;

(b) passing signals in the return path of the communication system through a bandpass filter passband or window; and (c) attenuating the window by a predetermined amount such that the signals passing through the window are attenuated thereby.

36. The method as recited in claim 35, wherein the communication system is a cable television system having a headend and a subscriber end, and wherein said step (a) includes passing RF television programming signals transmitted from the headend through said highpass filter passband; and said step (b) includes passing signals transmitted from the subscriber end through said window.

37. The method as recited in claim 35, wherein said step (c) includes attenuating the window by 6 dB.

38. The method as recited in claim 35, wherein said step (c) includes attenuating the window by 12 dB.

39. A passive filter for controlling the return path loss in a communication system having a forward path and a return path, said passive filter comprising:

a housing having an interior volume of less than about 5 cubic inches;

a first terminal and a second terminal;

a passive filter network, mounted inside said housing and coupled to said first and said second terminals and to ground, said filter network having a first passband which passes signals in the forward path and a second passband which passes signals in the return path, said filter network including a passive attenuator circuit, associated with the second passband, which attenuates signals in the return path by a predetermined amount as the signals pass through the second passband of said filter network.

40. The passive filter as recited in claim 39, wherein said passive filter network is a windowed highpass filter.

41. The passive filter as recited in claim 39, wherein said passive filter network is a diplex filter.

42. The passive filter as recited in claim 39, wherein the communication system is a cable television system having a headend and a subscriber end, the signals in the forward path being RF television program signals transmitted from the headend, and the signals in the return path being signals transmitted from the subscriber end.

* * * * *

(12) EX PARTE REEXAMINATION CERTIFICATE (7330th)
United States Patent
Tresness et al.

(10) Number: US 5,745,838 C1
(45) Certificate Issued: Jan. 26, 2010

(54) RETURN PATH FILTER

(75) Inventors: Andrew F. Tresness, Manlius, NY (US);
Martin L. Zelenz, DeWitt, NY (US)

(73) Assignee: Arrow Communication Laboratories, Inc., Syracuse, NY (US)

Reexamination Request:
No. 90/009,097, Apr. 1, 2008

Reexamination Certificate for:
Patent No.: 5,745,838
Issued: Apr. 28, 1998
Appl. No.: 08/818,231
Filed: Mar. 14, 1997

(51) Int. Cl.
*H03H 7/00* (2006.01)
*H03H 7/46* (2006.01)
*H04H 1/02* (2006.01)
*H04H 1/00* (2006.01)
*H04H 7/173* (2006.01)
*H04H 7/14* (2006.01)

(52) U.S. Cl. .................................... 725/128; 348/E7.07
(58) Field of Classification Search .................. None
See application file for complete search history.

(56) References Cited

U.S. PATENT DOCUMENTS

| | | |
|---|---|---|
| 3,548,120 A | 12/1970 | Tarassoff |
| 4,397,037 A | 8/1983 | Theriault |
| 4,451,803 A | 5/1984 | Holdsworth et al. |
| 4,583,220 A | 4/1986 | Blackburn et al. |
| 4,701,726 A | 10/1987 | Holdsworth |
| 4,755,776 A | 7/1988 | Preschutti |
| 4,835,494 A | 5/1989 | Preschutti |
| 4,845,447 A | 7/1989 | Holdsworth |
| 4,901,043 A | 2/1990 | Palinkas |
| 4,947,386 A | 8/1990 | Preschutti |
| 4,963,966 A | 10/1990 | Harney et al. |
| 4,970,722 A | 11/1990 | Preschutti |
| 4,982,440 A | 1/1991 | Dufresne et al. |
| 5,126,840 A | 6/1992 | Dufresne et al. |
| 5,130,664 A | 7/1992 | Pavlic et al. |
| 5,148,133 A | 9/1992 | Zennamo, Jr. et al. |
| 5,150,087 A | 9/1992 | Yoshie et al. |
| 5,191,459 A | 3/1993 | Thompson et al. |
| 5,278,525 A | 1/1994 | Palinkas |
| 5,379,141 A | 1/1995 | Thompson et al. |
| 5,404,161 A | 4/1995 | Douglass et al. |
| 5,425,027 A | 6/1995 | Baran |
| 5,432,488 A | 7/1995 | Kotani et al. |
| 5,434,610 A | 7/1995 | Loveless |
| 5,440,282 A | 8/1995 | Devendorf et al. |
| 5,481,389 A | 1/1996 | Pidgeon et al. |
| 5,675,300 A | 10/1997 | Romerein |

(Continued)

FOREIGN PATENT DOCUMENTS

GB  2218308 A1  11/1989

(Continued)

OTHER PUBLICATIONS

Dean A. Stoneback and William F. Beck, "Designing the Return System for Full Digital Services", General Instrument Communications, 1995.

(Continued)

*Primary Examiner*—Fred Ferris

(57) ABSTRACT

A filter for controlling the return path loss in a multi-channel communication system having forward and return paths. The filter comprises a forward path filter network, and a return path filter network. The forward path network passes signals in the forward path, and includes at least one resonant circuit component, such as a capacitor, which is coupled to the return path network. The return path network passes signals in the return path, and includes at least one resonant circuit, such as a series LC trap to ground. A combined resonant circuit is formed, at least in part, by the resonant circuit of the return path network and the resonant circuit component of the forward path network (e.g., a combined series LC trap to ground). The return path network further includes an attenuator network which is designed to attenuate the signals in the return path frequency band. Preferably, the attenuator network is a resistive network which provides a predetermined amount of flat loss.

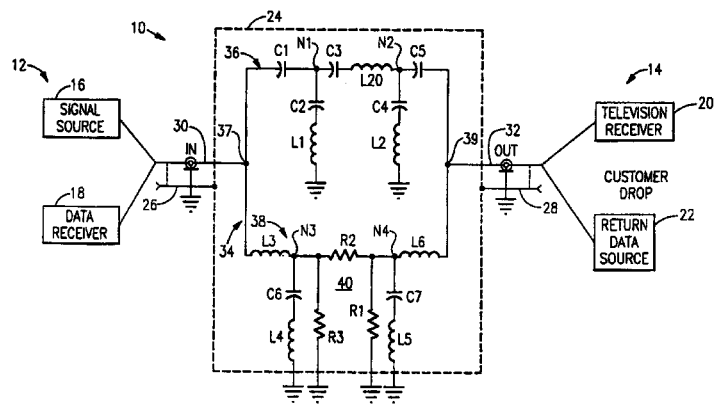

U.S. PATENT DOCUMENTS

| | | | |
|---|---|---|---|
| 5,738,525 | A | 4/1998 | Davies |
| 5,819,159 | A | 10/1998 | Dail |
| 5,835,844 | A | 11/1998 | Stoneback et al. |
| 5,845,191 | A | 12/1998 | Morgan |
| 5,881,362 | A | 3/1999 | Eldering et al. |
| 6,006,066 | A | 12/1999 | Krimmel |
| 6,094,211 | A | 7/2000 | Baran et al. |
| 6,321,384 | B1 | 11/2001 | Eldering |

FOREIGN PATENT DOCUMENTS

| | | | |
|---|---|---|---|
| GB | 2246930 | B2 | 2/1992 |
| GB | 2279208 | B2 | 12/1994 |
| JP | 50-76720 | A1 | 1/1975 |
| JP | 50-46427 | A1 | 4/1975 |
| JP | 50-93534 | A1 | 7/1975 |
| JP | 50-93535 | A1 | 7/1975 |
| JP | 51-54306 | A1 | 5/1976 |
| JP | 53-27125 | A1 | 8/1978 |
| JP | 55-148266 | A1 | 10/1980 |
| JP | 55-149518 | A1 | 11/1980 |
| JP | 59-97232 | A1 | 6/1984 |
| JP | 59-215185 | A1 | 12/1984 |
| JP | 1-107218 | A1 | 7/1989 |
| JP | 5-168014 | A1 | 7/1993 |
| JP | 5-268584 | A1 | 10/1993 |
| JP | 7-284083 | A1 | 10/1995 |
| JP | 9-162788 | A1 | 6/1997 |

OTHER PUBLICATIONS

Technical Description of General Instrument EH–45–MS In Line Equalizer, catalog section A–6, p. 27, circa 1987, and related schematic.

Arcom Sales Brochure circa 1980's showing typical packaging (p. 3) and dimensions of passive filters of the era (p. 4).

Society of Cable Telecommunications Engineers Publications Interface Practices Subcommittee IPS SP 202 (¶2.1.2), Rev. 7 Feb. 11, 2002 (pp. 1–10), IPS SP 206 Rev. 17, May 13, 2005 (pp. i–6) (¶2.1.3) and 207 ANSI/SCTE 762003 (Formerly IPS SP 2007) pp.i–4) (¶2.1.3), Issued between 1999 and 2005.

EP Search Report, May 6, 2005.

JP Office Action, Jan, 25, 2002,

Int Search Rport, Aug. 12, 1998.

Wenzel, Robert J., Wideband High–Selectivity Diplexers Utilizing Digital Elliptic Filters, 1967, pp. 669–680, IEEE Transactions on Microwave Theory and Techniques, vol. MTT–15, No. 12, Dec. 1967.

Stoneback, Dean A. & Beck, William F., Designing the Return System for Full Digital Services, 1996, pp. 269–277, General Instrument Communications.

Landee, Robert W. et al., Electronic Designer's Handbook, 1957, p. 17–17, McGraw–Hill Book Co., New York, NY.

Kimball, Harold, R., Motion Picture Sound Engineering, 1938, pp. 258–259 & 328–329, Van Nostrand, New York.

The Bell System Technical Journal; Apr. 1969, pp. 874–875.

Bartlett, Eugene R., Cable Television & Operations: HDTV & NTSC Systems, 1990, pp. 37–42 McGraw–Hill, Inc., New York, NY.

Geffe, Philip R., Simplified Modern Filter Design, 1963, pp. 52–54 John F. Rider Publisher, Inc., New York, NY.

Sprint North Supply Catalog, pp. 50 & 57, 1995, New Century, Kansas, p. 50, Jerrold—General Instrument diplex filters, SX Series, Model # DF1–*; p. 57, Scientific–Atlanta diplex and surge filters, plug–in equalizers and pads, and interstage filters and equalizers for two–way CATV sytems.

TVC Incorporated Catalog, pp. 3–41 & 3–49, 1995. p. 3–41, Texscan diplex filters; and p. 3–49, Texscan Amplifier and Line Extender stations.

ANTEC Catalog, pp. C–30 & C–31, 1994. P. C–30, Scientific–Atlanta diplex filters, sub–split diplex filters for trunk stations and line extenders; p. C3–31, Scientific–Atlanta plug–in cable equalizers, plug–in pads and true tilt correction networks.

C–COR Product Literature, Entitled Data Products C–COR Electronics Inc., Main Line Passives, Two–Way Equalizer Housings, Oct. 1, 1986, p. D–9.

C–COR Catalog Page, Main Line Passives, Aug. 1, 1993, p. 39.

C–COR EFM–112 Schematic, Jan. 2, 1985.

C–COR EFM–112 Production Alignment and Test Procedure, Jun. 27, 1990.

C–COR EFM–186 Schematic, Sep. 1986.

C–COR EFM–186 Production Alignment and Test Procedure, Aug. 2, 1989.

Passive Decal Drawing, EFM–112 & –186, Jun. 14, 1990.

Declaration of George M. Savereno Regarding Documents Produced in Response to Subpoena Issued by John Mezzalingua Associates, Inc., Oct. 31, 2006, pp. 1–2.

Consolidated Complaint filed by Patent Owner (plaintiff) in patent infringement action entitled, *Arrow Communication Laboratories, Inc. and Tresness Irrevocable Patent Trust* v. *John Mezzalingua Associates, Inc.*, Civil Action No. 05–CV–1456 (NAM/DEP) ("Concurrent Litigation"), Mar. 20, 2007, pp. 1–8.

Answer to Consolidated Complaint and Counterclaims filed by Third–Party Requester (defendant) in the Concurrent Litigation, Mar. 20, 2007, pp. 1–25.

Letter from Lawrence Trapani to Kenneth Watov, dated Oct. 4, 2002, pp. 1–3.

Arcom Website Pages, Jun. 14, 2006, pp. PPC012307, PPC012309 & PPC012311.

Reply to Counter–Plaintiff's Consolidated Counterclaims etc., filed by Patent Owner in the Concurrent Litigation, Mar. 20, 2007, pp. 1–16.

Philips Catalog pages, dated Apr. 1, 2001, pp. 589–590 & 595–596.

Magnavox 7–DSE/** Schematic, dated Feb. 21, 1991, one page.

Letter from Kenneth Watov to Lawrence Trapani, dated Aug. 23, 2002, pp. 1–5.

Letter from Kenneth Watov to Lawrence Trapani, dated Dec. 13, 2002, pp. 1–4.

Boylestad, Robert L., Introductory Circuit Analysis, 9th Ed., 2000, Prentice Hall, NJ, pp. 916–918, 926–933.

Geffe, Philip R., Simplified Modern Filter Design, 1963, John F. Rider Publisher, Inc., pp. vii–viii (Preface), pp. 1–7, pp. 52–54, pp. 144–163.

US 5,745,838 C1

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 12–16, 19–20, 39 and 41–42 are cancelled.

New claims 43–62 are added and determined to be patentable.

Claims 1–11, 17, 18, 21–38 and 40 were not reexamined.

43. *A passive CATV filter for controlling the return path loss in a two-way CATV system that has a forward path and a return path, said filter comprising:*

*a housing having an interior volume of less than about 5 cubic inches, said housing having a generally tubular shape with a length not exceeding about 80 mm and a diameter not exceeding about 25 mm;*

*a first terminal and a second terminal;*

*a highpass network of an order not exceeding five, mounted inside said housing and coupled to said first and said second terminals and to ground, said highpass network having a passband that passes signals in the forward path of the CATV system and a stopband that attenuates signals in the return path of the CATV system; and*

*a lowpass network, mounted inside said housing and coupled to said first and said second terminals and to ground, said lowpass network having a passband that passes signals in the return path of the CATV system and a stopband that attenuates signals in the forward path of the CATV system, said lowpass network including a passive attenuator network that attenuates signals in the return path of the CATV system as the signals pass through said lowpass network,*

*wherein signals in the return path that pass through said passive CATV filter are attenuated by a substantially constant amount.*

44. *The passive CATV filter as recited in claim 43, wherein said highpass network is an elliptic-function highpass filter.*

45. *The passive CATV filter as recited in claim 43, wherein said highpass network consists essentially of fixed-value passive electrical components, and wherein the lowpass filter branches of said lowpass network consist essentially of fixed-value passive electrical components.*

46. *The passive CATV filter as recited in claim 43, wherein said lowpass network further includes a plurality of lowpass filter branches apart from the passive attenuator network, the plurality of lowpass filter branches not exceeding four.*

47. *The passive CATV filter as recited in claim 43, wherein the passive attenuator network is a resistive network.*

48. *The passive CATV filter as recited in claim 43, wherein said highpass and said lowpass networks are mounted on a single circuit board.*

49. *The passive CATV filter as recited in claim 43, wherein the substantially constant amount of attenuation is fixed in the range of from about 3 dB to about 35 dB.*

50. *The passive CATV filter as recited in claim 43, wherein said highpass and said lowpass networks are configured as a substantially complementary set of highpass and lowpass filters.*

51. *The passive CATV filter as recited in claim 43, further comprising a power bypass circuit, coupled to the passive attenuator network, for passing a power signal around the attenuator network.*

52. *The passive CATV filter as recited in claim 43, further comprising an equalization circuit, coupled to said lowpass network, for altering the passband of said lowpass network such that the altered passband substantially complements an anticipated frequency slope of the cable to which said passive filter is to be coupled, whereby the equalization circuit substantially compensates for the anticipated frequency slope of the cable.*

53. *A passive CATV filter for controlling the return path loss in a two-way CATV system that has a forward path and a return path, said filter consisting essentially of:*

*a housing containing an interior volume of less than about 5 cubic inches, said housing having a generally tubular shape with a length not exceeding about 80 mm and a diameter not exceeding about 25 mm, said housing further including first and second connectors;*

*a circuit board mounted inside said housing;*

*a first terminal associated with the first connector of said housing and a second terminal associated with the second connector of said housing;*

*a highpass network of an order not exceeding five, mounted on said circuit board and coupled to said first and said second terminals and to ground, said highpass network having a passband that passes signals in the forward path of the CATV system and a stopband that attenuates signals in the return path of the CATV system; and*

*a lowpass network, mounted on said circuit board and coupled to said first and said second terminals and to ground, said lowpass network having a passband that passes signals in the return path of the CATV system and a stopband that attenuates signals in the forward path of the CATV system, said lowpass network including a passive attenuator network that attenuates signals in the return path of the CATV system as the signals pass through said lowpass network,*

*wherein signals in the return path that pass through said passive CATV filter are attenuated by a substantially constant amount.*

54. *The passive CATV filter as recited in claim 53, wherein said lowpass network further includes a plurality of lowpass filter branches apart from the passive attenuator network, the plurality of lowpass filter branches not exceeding four.*

55. *The passive CATV filter as recited in claim 53, wherein said highpass network is an elliptic-function highpass filter.*

56. *The passive CATV filter as recited in claim 53, wherein said highpass network consists essentially of fixed-value passive electrical components, and wherein the lowpass filter branches of said lowpass network consist essentially of fixed-value passive electrical components.*

57. *The passive CATV filter as recited in claim 53, wherein the passive attenuator network is a resistive network.*

58. The passive CATV filter as recited in claim 53, wherein said highpass and said lowpass networks are mounted on a single circuit board.

59. The passive CATV filter as recited in claim 53, wherein the substantially constant amount of attenuation is fixed in the range of from about 3 dB to about 35 dB.

60. The passive CATV filter as recited in claim 53, wherein said highpass and said lowpass networks are configured as a substantially complementary set of highpass and lowpass filters.

61. A passive CATV filter for controlling the return path loss in a two-way CATV system that has a forward path and a return path, said filter comprising:

a housing containing an interior volume of less than about 5 cubic inches, said housing having a generally tubular shape with a length not exceeding about 80 mm and a diameter not exceeding about 25 mm;

a first terminal and a second terminal; and a passive network of electrical components mounted inside said housing and coupled to said first and said second terminals and to ground, said passive network being the only network of electrical components mounted inside said housing, said passive network consisting essentially of— a highpass network of an order not exceeding five, having a passband that passes signals in the forward path of the CATV system and a stopband that attenuates signals in return path of the CATV system, and a lowpass network having a passband that passes signals in the return path of the CATV system and a stopband that attenuates signals in the forward path of the CATV system, said lowpass network including a passive attenuator network that attenuates signals in the return path of the CATV system as the signals pass through said lowpass network, wherein signals in the return path that pass through said passive CATV filter are attenuated by a substantially constant amount.

62. The passive CATV filter as recited in claim 61, wherein said lowpass network further includes a plurality of lowpass filter branches apart from the passive attenuator network, the plurality of lowpass filter branches not exceeding four.

\* \* \* \* \*